United States Patent
Chen et al.

(10) Patent No.: US 8,077,505 B2
(45) Date of Patent: Dec. 13, 2011

(54) BIPOLAR SWITCHING OF PHASE CHANGE DEVICE

(75) Inventors: Yi-Chou Chen, Hsinchu (TW); Yuyu Lin, Taipei (TW)

(73) Assignee: Macronix International Co., Ltd., Hsinchu (TW)

( * ) Notice: Subject to any disclaimer, the term of this patent is extended or adjusted under 35 U.S.C. 154(b) by 37 days.

(21) Appl. No.: 12/432,055

(22) Filed: Apr. 29, 2009

(65) Prior Publication Data
US 2009/0279350 A1  Nov. 12, 2009

Related U.S. Application Data

(60) Provisional application No. 61/051,327, filed on May 7, 2008.

(51) Int. Cl.
*G11C 11/00* (2006.01)
(52) U.S. Cl. .......................... 365/163; 365/148
(58) Field of Classification Search .................. 365/163, 365/148
See application file for complete search history.

(56) References Cited

U.S. PATENT DOCUMENTS

| | | | |
|---|---|---|---|
| 3,271,591 A | 9/1966 | Ovshinsky | |
| 3,530,441 A | 9/1970 | Ovshinsky | |
| 4,452,592 A | 6/1984 | Tsai | |
| 4,599,705 A | 7/1986 | Holmberg et al. | |
| 4,719,594 A | 1/1988 | Young et al. | |
| 4,769,339 A | 9/1988 | Ishii | |
| 4,876,220 A | 10/1989 | Mohsen et al. | |
| 4,959,812 A | 9/1990 | Momodomi et al. | |
| 5,106,775 A | 4/1992 | Kaga et al. | |
| 5,166,096 A | 11/1992 | Cote et al. | |
| 5,166,758 A | 11/1992 | Ovshinsky et al. | |
| 5,177,567 A | 1/1993 | Klersy et al. | |
| 5,332,923 A | 7/1994 | Takeuchi et al. | |
| 5,391,901 A | 2/1995 | Tanabe et al. | |
| 5,515,488 A | 5/1996 | Hoppe et al. | |
| 5,534,712 A | 7/1996 | Ovshinsky et al. | |
| 5,550,396 A | 8/1996 | Tsutsumi et al. | |
| 5,687,112 A | 11/1997 | Ovshinsky | |
| 5,688,713 A | 11/1997 | Linliu et al. | |

(Continued)

FOREIGN PATENT DOCUMENTS
CN  101004947 A  7/2007

OTHER PUBLICATIONS

Baek, I.G., et al., "Highly Scalable Non-volatile Resistive Memory using Simple Binary Oxide Driven by Asymmetric Unipolar Voltage Pulses," IEEE IEDM 2004, 4 pages.

(Continued)

*Primary Examiner* — Anh Phung
*Assistant Examiner* — Hien Nguyen
(74) *Attorney, Agent, or Firm* — Haynes Beffel & Wolfeld LLP

(57) ABSTRACT

Memory devices and methods for operating such devices are described herein. A method as described herein includes applying a reset bias arrangement to a memory cell to change the resistance state from the lower resistance state to the higher resistance state. The reset bias arrangement comprises a first voltage pulse. The method further includes applying a set bias arrangement to the memory cell to change the resistance state from the higher resistance state to the lower resistance state. The set bias arrangement comprises a second voltage pulse, the second voltage pulse having a voltage polarity different from that of the first voltage pulse.

20 Claims, 21 Drawing Sheets

U.S. PATENT DOCUMENTS

| | | | |
|---|---|---|---|
| 5,716,883 A | 2/1998 | Tseng et al. | |
| 5,754,472 A | 5/1998 | Sim et al. | |
| 5,789,277 A | 8/1998 | Zahorik et al. | |
| 5,789,758 A | 8/1998 | Reinberg | |
| 5,814,527 A | 9/1998 | Wolstenholme et al. | |
| 5,831,276 A | 11/1998 | Gonzalez et al. | |
| 5,837,564 A | 11/1998 | Sandhu et al. | |
| 5,869,843 A | 2/1999 | Harshfield | |
| 5,879,955 A | 3/1999 | Gonzalez et al. | |
| 5,902,704 A | 5/1999 | Schoenborn et al. | |
| 5,920,788 A | 7/1999 | Reinberg | |
| 5,933,365 A | 8/1999 | Klersy et al. | |
| 5,952,671 A | 9/1999 | Reinberg et al. | |
| 5,958,358 A | 9/1999 | Tenne et al. | |
| 5,970,336 A | 10/1999 | Wolstenholme et al. | |
| 5,985,698 A | 11/1999 | Gonzalez et al. | |
| 5,998,244 A | 12/1999 | Wolstenholme et al. | |
| 6,011,725 A | 1/2000 | Eitan et al. | |
| 6,025,220 A | 2/2000 | Sandhu | |
| 6,031,287 A | 2/2000 | Harshfield | |
| 6,034,882 A | 3/2000 | Johnson et al. | |
| 6,046,951 A | 4/2000 | El Hajji et al. | |
| 6,066,870 A | 5/2000 | Siek | |
| 6,075,719 A | 6/2000 | Lowrey et al. | |
| 6,077,674 A | 6/2000 | Schleifer et al. | |
| 6,077,729 A | 6/2000 | Harshfield | |
| 6,087,269 A | 7/2000 | Williams | |
| 6,087,674 A | 7/2000 | Ovshinsky et al. | |
| 6,104,038 A | 8/2000 | Gonzalez et al. | |
| 6,111,264 A | 8/2000 | Wolstenholme et al. | |
| 6,114,713 A | 9/2000 | Zahorik | |
| 6,117,720 A | 9/2000 | Harshfield | |
| 6,147,395 A | 11/2000 | Gilgen | |
| 6,150,253 A | 11/2000 | Doan et al. | |
| 6,153,890 A | 11/2000 | Wolstenholme et al. | |
| 6,177,317 B1 | 1/2001 | Huang et al. | |
| 6,185,122 B1 | 2/2001 | Johnson et al. | |
| 6,189,582 B1 | 2/2001 | Reinberg et al. | |
| 6,236,059 B1 | 5/2001 | Wolstenholme et al. | |
| RE37,259 E | 7/2001 | Ovshinsky | |
| 6,271,090 B1 | 8/2001 | Huang et al. | |
| 6,280,684 B1 | 8/2001 | Yamada et al. | |
| 6,287,887 B1 | 9/2001 | Gilgen | |
| 6,291,137 B1 | 9/2001 | Lyons et al. | |
| 6,314,014 B1 | 11/2001 | Lowrey et al. | |
| 6,316,348 B1 | 11/2001 | Fu et al. | |
| 6,320,786 B1 | 11/2001 | Chang et al. | |
| 6,326,307 B1 | 12/2001 | Lindley et al. | |
| 6,337,266 B1 | 1/2002 | Zahorik | |
| 6,339,544 B1 | 1/2002 | Chiang et al. | |
| 6,351,406 B1 | 2/2002 | Johnson et al. | |
| 6,372,651 B1 | 4/2002 | Yang et al. | |
| 6,380,068 B2 | 4/2002 | Jeng et al. | |
| 6,420,215 B1 | 7/2002 | Knall et al. | |
| 6,420,216 B1 | 7/2002 | Clevenger et al. | |
| 6,420,725 B1 | 7/2002 | Harshfield | |
| 6,423,621 B2 | 7/2002 | Doan et al. | |
| 6,429,064 B1 | 8/2002 | Wicker | |
| 6,440,837 B1 | 8/2002 | Harshfield | |
| 6,462,353 B1 | 10/2002 | Gilgen | |
| 6,483,736 B2 | 11/2002 | Johnson et al. | |
| 6,487,106 B1 | 11/2002 | Kozicki | |
| 6,487,114 B2 | 11/2002 | Jong et al. | |
| 6,501,111 B1 | 12/2002 | Lowrey | |
| 6,511,867 B2 | 1/2003 | Lowrey et al. | |
| 6,512,241 B1 | 1/2003 | Lai | |
| 6,512,263 B1 | 1/2003 | Yuan et al. | |
| 6,514,788 B2 | 2/2003 | Quinn | |
| 6,514,820 B2 | 2/2003 | Ahn et al. | |
| 6,534,781 B2 | 3/2003 | Dennison | |
| 6,545,903 B1 | 4/2003 | Wu | |
| 6,545,907 B1 | 4/2003 | Lowrey et al. | |
| 6,551,866 B1 | 4/2003 | Maeda et al. | |
| 6,555,860 B2 | 4/2003 | Lowrey et al. | |
| 6,563,156 B2 | 5/2003 | Harshfield | |
| 6,566,700 B2 | 5/2003 | Xu | |
| 6,567,293 B1 | 5/2003 | Lowrey et al. | |
| 6,576,546 B2 | 6/2003 | Gilbert et al. | |
| 6,579,760 B1 | 6/2003 | Lung | |
| 6,586,761 B2 | 7/2003 | Lowrey | |
| 6,589,714 B2 | 7/2003 | Maimon et al. | |
| 6,593,176 B2 | 7/2003 | Dennison | |
| 6,596,589 B2 | 7/2003 | Tseng et al. | |
| 6,597,009 B2 | 7/2003 | Wicker | |
| 6,605,527 B2 | 8/2003 | Dennison et al. | |
| 6,605,821 B1 | 8/2003 | Lee et al. | |
| 6,607,974 B2 | 8/2003 | Harshfield | |
| 6,613,604 B2 | 9/2003 | Maimon et al. | |
| 6,617,192 B1 | 9/2003 | Lowrey et al. | |
| 6,621,095 B2 | 9/2003 | Chiang et al. | |
| 6,625,054 B2 | 9/2003 | Lowrey et al. | |
| 6,627,530 B2 | 9/2003 | Li et al. | |
| 6,639,849 B2 | 10/2003 | Takahashi et al. | |
| 6,673,700 B2 | 1/2004 | Dennison et al. | |
| 6,674,115 B2 | 1/2004 | Hudgens et al. | |
| 6,677,678 B2 | 1/2004 | Biolsi et al. | |
| 6,744,088 B1 | 6/2004 | Dennison | |
| 6,750,079 B2 | 6/2004 | Lowrey et al. | |
| 6,750,101 B2 | 6/2004 | Lung et al. | |
| 6,791,102 B2 | 9/2004 | Johnson et al. | |
| 6,797,979 B2 | 9/2004 | Chiang et al. | |
| 6,800,504 B2 | 10/2004 | Li et al. | |
| 6,800,563 B2 | 10/2004 | Xu | |
| 6,815,704 B1 | 11/2004 | Chen | |
| 6,838,692 B1 | 1/2005 | Lung et al. | |
| 6,850,432 B2 | 2/2005 | Lu et al. | |
| 6,859,389 B2 | 2/2005 | Idehara | |
| 6,861,267 B2 | 3/2005 | Xu et al. | |
| 6,864,500 B2 | 3/2005 | Gilton | |
| 6,864,503 B2 | 3/2005 | Lung et al. | |
| 6,867,638 B2 | 3/2005 | Saiki et al. | |
| 6,881,603 B2 | 4/2005 | Lai | |
| 6,888,750 B2 | 5/2005 | Walker et al. | |
| 6,894,304 B2 | 5/2005 | Moore | |
| 6,894,305 B2 | 5/2005 | Yi et al. | |
| 6,900,517 B2 | 5/2005 | Tanaka et al. | |
| 6,903,362 B2 | 6/2005 | Wyeth et al. | |
| 6,909,107 B2 | 6/2005 | Rodgers et al. | |
| 6,910,907 B2 | 6/2005 | Layadi et al. | |
| 6,927,410 B2 | 8/2005 | Chen | |
| 6,928,022 B2 | 8/2005 | Cho et al. | |
| 6,933,516 B2 | 8/2005 | Xu | |
| 6,936,544 B2 | 8/2005 | Huang et al. | |
| 6,936,840 B2 | 8/2005 | Sun et al. | |
| 6,937,507 B2 | 8/2005 | Chen | |
| 6,943,365 B2 | 9/2005 | Lowrey et al. | |
| 6,969,866 B1 | 11/2005 | Lowrey et al. | |
| 6,972,428 B2 | 12/2005 | Maimon | |
| 6,972,430 B2 | 12/2005 | Casagrande et al. | |
| 6,977,181 B1 | 12/2005 | Raberg et al. | |
| 6,992,932 B2 | 1/2006 | Cohen et al. | |
| 7,023,009 B2 | 4/2006 | Kostylev et al. | |
| 7,033,856 B2 | 4/2006 | Lung et al. | |
| 7,038,230 B2 | 5/2006 | Chen et al. | |
| 7,038,938 B2 | 5/2006 | Kang et al. | |
| 7,042,001 B2 | 5/2006 | Kim et al. | |
| 7,054,183 B2 | 5/2006 | Rinerson et al. | |
| 7,067,837 B2 | 6/2006 | Hwang et al. | |
| 7,067,864 B2 | 6/2006 | Nishida et al. | |
| 7,067,865 B2 | 6/2006 | Lung et al. | |
| 7,078,273 B2 | 7/2006 | Matsuoka et al. | |
| 7,085,154 B2 | 8/2006 | Cho et al. | |
| 7,099,180 B1 | 8/2006 | Dodge et al. | |
| 7,115,927 B2 | 10/2006 | Hideki et al. | |
| 7,122,281 B2 | 10/2006 | Pierrat | |
| 7,122,824 B2 | 10/2006 | Khouri et al. | |
| 7,126,149 B2 | 10/2006 | Iwasaki et al. | |
| 7,126,847 B2 | 10/2006 | Ha et al. | |
| 7,132,675 B2 | 11/2006 | Gilton | |
| 7,151,273 B2 | 12/2006 | Campbell et al. | |
| 7,154,774 B2 | 12/2006 | Bedeschi et al. | |
| 7,158,411 B2 | 1/2007 | Yeh et al. | |
| 7,164,147 B2 | 1/2007 | Lee et al. | |
| 7,166,533 B2 | 1/2007 | Happ | |
| 7,169,635 B2 | 1/2007 | Kozicki | |
| 7,190,607 B2 | 3/2007 | Cho et al. | |
| 7,202,493 B2 | 4/2007 | Lung et al. | |

| | | |
|---|---|---|
| 7,208,751 B2 | 4/2007 | Ooishi et al. |
| 7,214,958 B2 | 5/2007 | Happ |
| 7,220,983 B2 | 5/2007 | Lung |
| 7,229,883 B2 | 6/2007 | Wang et al. |
| 7,238,959 B2 | 7/2007 | Chen |
| 7,238,994 B2 | 7/2007 | Chen et al. |
| 7,248,494 B2 | 7/2007 | Oh et al. |
| 7,251,157 B2 | 7/2007 | Osada et al. |
| 7,253,429 B2 | 8/2007 | Klersy et al. |
| 7,254,059 B2 | 8/2007 | Li et al. |
| 7,269,052 B2 | 9/2007 | Segal et al. |
| 7,277,317 B2 | 10/2007 | Le Phan et al. |
| 7,291,556 B2 | 11/2007 | Choi et al. |
| 7,295,464 B2 | 11/2007 | Cho et al. |
| 7,309,630 B2 | 12/2007 | Fan et al. |
| 7,321,130 B2 | 1/2008 | Lung et al. |
| 7,323,708 B2 | 1/2008 | Lee et al. |
| 7,323,734 B2 | 1/2008 | Ha et al. |
| 7,332,370 B2 | 2/2008 | Chang et al. |
| 7,335,906 B2 | 2/2008 | Toda |
| 7,336,526 B2 | 2/2008 | Osada et al. |
| 7,351,648 B2 | 4/2008 | Furukawa et al. |
| 7,359,231 B2 | 4/2008 | Venkataraman et al. |
| 7,364,935 B2 | 4/2008 | Lung et al. |
| 7,365,385 B2 | 4/2008 | Abbott |
| 7,379,328 B2 | 5/2008 | Osada et al. |
| 7,385,235 B2 | 6/2008 | Lung et al. |
| 7,388,273 B2 | 6/2008 | Burr et al. |
| 7,394,088 B2 | 7/2008 | Lung |
| 7,397,060 B2 | 7/2008 | Lung |
| 7,400,522 B2 | 7/2008 | Toda et al. |
| 7,423,300 B2 | 9/2008 | Lung et al. |
| 7,426,134 B2 | 9/2008 | Happ et al. |
| 7,440,308 B2 | 10/2008 | Jeong et al. |
| 7,449,710 B2 | 11/2008 | Lung |
| 7,473,576 B2 | 1/2009 | Lung |
| 7,479,649 B2 | 1/2009 | Lung |
| 7,485,891 B2 | 2/2009 | Hamann et al. |
| 7,502,252 B2 | 3/2009 | Fuji et al. |
| 7,505,330 B2 | 3/2009 | Pawlowski et al. |
| 7,507,986 B2 | 3/2009 | Lung |
| 7,514,334 B2 | 4/2009 | Chen et al. |
| 7,514,705 B2 | 4/2009 | Breitwisch et al. |
| 7,515,461 B2 | 4/2009 | Happ et al. |
| 2002/0070457 A1 | 6/2002 | Sun et al. |
| 2002/0113273 A1 | 8/2002 | Hwang et al. |
| 2003/0072195 A1 | 4/2003 | Mikolajick |
| 2003/0095426 A1 | 5/2003 | Hush et al. |
| 2003/0186481 A1 | 10/2003 | Lung |
| 2004/0026686 A1 | 2/2004 | Lung |
| 2004/0051094 A1 | 3/2004 | Ooishi |
| 2004/0113137 A1 | 6/2004 | Lowrey |
| 2004/0165422 A1 | 8/2004 | Hideki et al. |
| 2004/0248339 A1 | 12/2004 | Lung |
| 2004/0256610 A1 | 12/2004 | Lung |
| 2005/0018526 A1 | 1/2005 | Lee |
| 2005/0029502 A1 | 2/2005 | Hudgens |
| 2005/0052904 A1 | 3/2005 | Cho et al. |
| 2005/0062087 A1 | 3/2005 | Chen et al. |
| 2005/0093022 A1 | 5/2005 | Lung |
| 2005/0127349 A1 | 6/2005 | Horak et al. |
| 2005/0141261 A1 | 6/2005 | Ahn |
| 2005/0145984 A1 | 7/2005 | Chen et al. |
| 2005/0167656 A1 | 8/2005 | Sun et al. |
| 2005/0191804 A1 | 9/2005 | Lai et al. |
| 2005/0195633 A1 | 9/2005 | Choi et al. |
| 2005/0201182 A1 | 9/2005 | Osada et al. |
| 2005/0212024 A1 | 9/2005 | Happ |
| 2005/0212026 A1 | 9/2005 | Chung et al. |
| 2005/0215009 A1 | 9/2005 | Cho |
| 2005/0263829 A1 | 12/2005 | Song et al. |
| 2006/0006472 A1 | 1/2006 | Jiang |
| 2006/0034112 A1 | 2/2006 | Oh et al. |
| 2006/0038221 A1 | 2/2006 | Lee et al. |
| 2006/0066156 A1 | 3/2006 | Dong et al. |
| 2006/0073642 A1 | 4/2006 | Yeh et al. |
| 2006/0091476 A1 | 5/2006 | Pinnow et al. |
| 2006/0094154 A1 | 5/2006 | Lung |
| 2006/0108667 A1 | 5/2006 | Lung |
| 2006/0110878 A1 | 5/2006 | Lung et al. |
| 2006/0110888 A1 | 5/2006 | Cho et al. |
| 2006/0113520 A1 | 6/2006 | Yamamoto et al. |
| 2006/0113521 A1 | 6/2006 | Lung |
| 2006/0118913 A1 | 6/2006 | Yi et al. |
| 2006/0124916 A1 | 6/2006 | Lung |
| 2006/0126395 A1 | 6/2006 | Chen et al. |
| 2006/0131555 A1 | 6/2006 | Liu et al. |
| 2006/0138467 A1 | 6/2006 | Lung |
| 2006/0154185 A1 | 7/2006 | Ho et al. |
| 2006/0157680 A1 | 7/2006 | Takaura et al. |
| 2006/0157681 A1 | 7/2006 | Chen et al. |
| 2006/0163554 A1 | 7/2006 | Lankhorst et al. |
| 2006/0172067 A1 | 8/2006 | Ovshinsky et al. |
| 2006/0175599 A1 | 8/2006 | Happ |
| 2006/0198183 A1 | 9/2006 | Kawahara et al. |
| 2006/0202245 A1 | 9/2006 | Zuliani et al. |
| 2006/0205108 A1 | 9/2006 | Maimon et al. |
| 2006/0211165 A1 | 9/2006 | Hwang et al. |
| 2006/0226409 A1 | 10/2006 | Burr et al. |
| 2006/0234138 A1 | 10/2006 | Fehlhaber et al. |
| 2006/0237756 A1 | 10/2006 | Park et al. |
| 2006/0245236 A1 | 11/2006 | Zaidi |
| 2006/0250885 A1 | 11/2006 | Cho et al. |
| 2006/0261392 A1 | 11/2006 | Lee et al. |
| 2006/0266993 A1 | 11/2006 | Suh et al. |
| 2006/0284157 A1 | 12/2006 | Chen et al. |
| 2006/0284158 A1 | 12/2006 | Lung et al. |
| 2006/0284214 A1 | 12/2006 | Chen |
| 2006/0284279 A1 | 12/2006 | Lung et al. |
| 2006/0286709 A1 | 12/2006 | Lung et al. |
| 2006/0286743 A1 | 12/2006 | Lung et al. |
| 2006/0289847 A1 | 12/2006 | Dodge |
| 2006/0289848 A1 | 12/2006 | Dennison |
| 2007/0007613 A1 | 1/2007 | Wang et al. |
| 2007/0008786 A1 | 1/2007 | Scheuerlein |
| 2007/0030721 A1 | 2/2007 | Segal et al. |
| 2007/0037101 A1 | 2/2007 | Morioka |
| 2007/0040159 A1 | 2/2007 | Wang |
| 2007/0051936 A1 | 3/2007 | Pellizzer et al. |
| 2007/0096162 A1 | 5/2007 | Happ et al. |
| 2007/0096248 A1 | 5/2007 | Philipp et al. |
| 2007/0108077 A1 | 5/2007 | Lung et al. |
| 2007/0108429 A1 | 5/2007 | Lung |
| 2007/0108430 A1 | 5/2007 | Lung |
| 2007/0108431 A1 | 5/2007 | Chen et al. |
| 2007/0109836 A1 | 5/2007 | Lung |
| 2007/0109843 A1 | 5/2007 | Lung et al. |
| 2007/0111429 A1 | 5/2007 | Lung |
| 2007/0115794 A1 | 5/2007 | Lung |
| 2007/0117315 A1 | 5/2007 | Lai et al. |
| 2007/0120104 A1 | 5/2007 | Ahn et al. |
| 2007/0121363 A1 | 5/2007 | Lung |
| 2007/0121374 A1 | 5/2007 | Lung et al. |
| 2007/0126040 A1 | 6/2007 | Lung |
| 2007/0131922 A1 | 6/2007 | Lung |
| 2007/0138458 A1 | 6/2007 | Lung |
| 2007/0140029 A1 | 6/2007 | Kim et al. |
| 2007/0147105 A1 | 6/2007 | Lung et al. |
| 2007/0153563 A1 | 7/2007 | Nirschl |
| 2007/0153570 A1 | 7/2007 | Suh |
| 2007/0154847 A1 | 7/2007 | Chen et al. |
| 2007/0155172 A1 | 7/2007 | Lai et al. |
| 2007/0156949 A1 | 7/2007 | Rudelic et al. |
| 2007/0158632 A1 | 7/2007 | Ho |
| 2007/0158633 A1 | 7/2007 | Lai et al. |
| 2007/0158645 A1 | 7/2007 | Lung |
| 2007/0158690 A1 | 7/2007 | Ho et al. |
| 2007/0158862 A1 | 7/2007 | Lung |
| 2007/0161186 A1 | 7/2007 | Ho |
| 2007/0170881 A1 | 7/2007 | Noh et al. |
| 2007/0173019 A1 | 7/2007 | Ho et al. |
| 2007/0173063 A1 | 7/2007 | Lung |
| 2007/0176261 A1 | 8/2007 | Lung |
| 2007/0187664 A1 | 8/2007 | Happ |
| 2007/0201267 A1 | 8/2007 | Happ et al. |
| 2007/0215852 A1 | 9/2007 | Lung |
| 2007/0224726 A1 | 9/2007 | Chen et al. |
| 2007/0235811 A1 | 10/2007 | Furukawa et al. |

| | | |
|---|---|---|
| 2007/0236989 A1 | 10/2007 | Lung |
| 2007/0246699 A1 | 10/2007 | Lung |
| 2007/0249090 A1 | 10/2007 | Philipp et al. |
| 2007/0252127 A1 | 11/2007 | Arnold et al. |
| 2007/0257300 A1 | 11/2007 | Ho et al. |
| 2007/0262388 A1 | 11/2007 | Ho et al. |
| 2007/0267618 A1 | 11/2007 | Zaidi et al. |
| 2007/0274121 A1 | 11/2007 | Lung et al. |
| 2007/0285960 A1 | 12/2007 | Lung et al. |
| 2007/0298535 A1 | 12/2007 | Lung |
| 2008/0006811 A1 | 1/2008 | Philipp et al. |
| 2008/0012000 A1 | 1/2008 | Harshfield |
| 2008/0014676 A1 | 1/2008 | Lung et al. |
| 2008/0025089 A1 | 1/2008 | Scheuerlein et al. |
| 2008/0043520 A1 | 2/2008 | Chen |
| 2008/0094871 A1 | 4/2008 | Parkinson |
| 2008/0101110 A1 | 5/2008 | Happ et al. |
| 2008/0137400 A1 | 6/2008 | Chen et al. |
| 2008/0138929 A1 | 6/2008 | Lung |
| 2008/0138930 A1 | 6/2008 | Lung |
| 2008/0138931 A1 | 6/2008 | Lung |
| 2008/0164453 A1 | 7/2008 | Breitwisch et al. |
| 2008/0165569 A1 | 7/2008 | Chen et al. |
| 2008/0165570 A1 | 7/2008 | Happ et al. |
| 2008/0165572 A1 | 7/2008 | Lung |
| 2008/0166875 A1 | 7/2008 | Lung |
| 2008/0179582 A1 | 7/2008 | Burr et al. |
| 2008/0180990 A1 | 7/2008 | Lung |
| 2008/0186755 A1 | 8/2008 | Lung et al. |
| 2008/0191187 A1 | 8/2008 | Lung et al. |
| 2008/0192534 A1 | 8/2008 | Lung |
| 2008/0197334 A1 | 8/2008 | Lung |
| 2008/0224119 A1 | 9/2008 | Burr et al. |
| 2008/0225489 A1 | 9/2008 | Cai et al. |
| 2008/0265234 A1 | 10/2008 | Breitwisch et al. |
| 2008/0303014 A1 | 12/2008 | Goux et al. |
| 2009/0001341 A1 | 1/2009 | Breitwisch et al. |
| 2009/0014704 A1 | 1/2009 | Chen et al. |
| 2009/0023242 A1 | 1/2009 | Lung |
| 2009/0027950 A1 | 1/2009 | Lam et al. |
| 2009/0042335 A1 | 2/2009 | Lung |
| 2009/0057641 A1 | 3/2009 | Lung |
| 2009/0098678 A1 | 4/2009 | Lung |
| 2009/0166603 A1 | 7/2009 | Lung |
| 2009/0273968 A1 | 11/2009 | Lamorey et al. |

OTHER PUBLICATIONS

Castro, D. Tio, et al., "Evidence of the Thermo-Electric Thomson Effect and Influence on the Program Conditions and Cell Optimization in Phase-Change Memory Cells," IEEE IEDM Dec. 10-12, 2007, pp. 315-315.

Chen, Y.C., et al., "A High Performance 180nm Nonvolatile Memory Cell Using Phase Change Sn-Doped $Ge_2Sb_2Te_5$ Chalcogenide," IEEE 2003, 4 pages.

Chen, Y.C., et al., "Ultra-Thin Phase-Change Bridge Memory Device Using GeSb," IEDM Tech. Dig. 2006, 777-780.

Hanzawa, Satoru, et al., "A 512kB Embedded Phase Change Memory with 416kB/s Write Throughput at 100µA Cell Write Current," ISSCC 2007, Session 26, Non-Volatile Memories, 2007, 3 pages.

Lankhorst, Martijn H.R., et al. "Low-cost and nanoscale non-volatile memory concept for future silicon chips," Nature Materials 4, 347-352, Apr. 1, 2005, 6 pages.

Lin, Y.Y., et al., "Fast Speed Bipolar Operation of Ge-Sb-Te Based Phase Change Bridge Devices," SSDM 2008, Session P-4 (2008) 3 pages.

Oh, Hyung-Rok, et al., "Enhanced Write Performance of a 64Mb Phase-Change Random Access Memory," ISCC 2005, Session 2, Non-Volatile Memory, 2005, 3 pages.

"Magnetic Bit Boost," www.sciencenews.org, Dec. 18 & 25, 2004, p. 389, vol. 166.

"New Memories Tap Spin, Gird for Battle," Science News, Apr. 3, 1999, p. 223, vol. 155.

"Optimized Thermal Capacitance in a Phase Change Memory Cell Design," IPCOM000141986D, IP.com Prior Art Database, Oct. 18, 2006, 4pp.

"Remembering on the Cheap," www.sciencenews.org, Mar. 19, 2005, p. 189, vol. 167.

"Thermal Conductivity of Crystalline Dielectrics" in CRC Handbook of Chemistry and Physics, Internet Version 2007, (87th edition), David R. Lide, ed. Taylor and Francis, Boca Raton, Fl, 2pp.

Adler, D. et al., "Threshold Switching in Chalcogenide-Glass Thin Films," J. Appl/Phys 51(6), Jun. 1980, pp. 3289-3309.

Adler, David, "Amorphous-Semiconductor Devices," Sci. Amer., vol. 236, pp. 36-48, May 1977.

Ahn, S. J. et al., "A Highly Manufacturable High Density Phase Change Memory of 64 Mb and Beyond," IEEE IEDM 2004, pp. 907-910.

Ahn, S. J. et al., "Highly Reliable 5nm Contact Cell Technology for 256Mb PRAM," VLSI Technology, Digest of Technical Papers, Jun. 14-16, 2005, pp. 98-99.

Atwood, G, et al., "90 nm Phase Change Technology with u Trench and Lance Cell Elements," VLSI Technology, Systems and Applications, Apr. 23-25, 2007, pp. 1-2.

Axon Technologies Corporation paper: Technology Description, published in 1997, pp. 1-6.

Bedeschi, F. et al., "4-MB MOSFET-Selected Phase-Change Memory Experimental Chip," IEEE, 2004, 4 PP.

Blake thesis, "Investigation of GeTeSb5 Chalcogenide Films for Use as an Analog Memory," AFIT/GE/ENG/00M-04, Mar. 2000, 121 pages.

Chao, Der-Sheng, et al., "Low Programming Current Phase Change Memory Cell with Double GST Thermally Confined Structure," Int'l Symp on VLSI Technology, Systems and Applications, Apr. 23-25, 2007, pp. 1-2.

Chen, AN et al., "Non-Volatile Resistive Switching for Advanced Memory Applications," IEEE IEDM, Dec. 5-7, 2005, 4 pp.

Cho, S. L. et al., "Highly Scalable On-axis Confined Cell Structure for High Density PRAM beyond 256Mb," 2005 Symposium on VLSI Technology Digest of Technical Papers, pp. 96-97.

Gibson, G. A. et al., "Phase-change Recording Medium that Enables Ultrahigh-density Electron-beam Data Storage," Applied Physics Letter, 2005, 3 pp., vol. 86.

Gill, Manzur et al., "A High-Performance Nonvolatile Memory Technology for Stand-Alone Memory and Embedded Applications," 2002 IEEE-ISSCC Technical Digest (TD 12.4), 7 pp.

Gleixner, "Phase Change Memory Reliability", 22nd NVSMW, Aug. 26, 2007, 46 pages.

Ha, Y. H. et al., "An Edge Contact Type Cell for Phase Change RAM Featuring Very Low Power Consumption," 2003 Symposium on VLSI Technology Digest of Technical Papers, pp. 175-176.

Happ, T. D. et al., "Novel None-Mask Self-Heating Pillar Phase Change Memory," 2006 Symposium on VLSI Technology, 2 pp.

Haring Bolivar, P. et al., "Lateral Design for Phase Change Random Access Memory Cells with Low-Current Consumption," presented at 3rd E*PCOS 04 Symposium in Balzers, Principality of Liechtenstein, Sep. 4-7, 2004, 4pp.

Horii, H. et al., "A Novel Cell Technology Using N-doped GeSbTe Films for Phase Change RAM," 2003 Symposium on VLSI Technology Digest of Technical Papers, pp. 177-178.

Hudgens, S. et al., "Overview of Phase-Change Chalcogenide Nonvolatile Memory Technology," MRS Bulletin, Nov. 2004, pp. 829-832.

Hwang, Y. N. et al., "Full Integration and Reliability Evaluation of Phase-change RAM Based on 0.24um-CMOS Technologies," 2003 Symposium on VLSI Technology Digest of Technical Papers, pp. 173-174.

Ielmini, Daniele, et al., "Recovery and Drift Dynamics of Resistance and Threshold Voltages in Phase-Change Memories," IEEE Transactions on Electron Devices, vol. 54, No. 2, Feb. 2007, 8 pages.

Iwasaki, Hiroko et al., "Completely Erasable Phase Change Optical Disk," Jpn. J. Appl. Phys., Feb. 1992, pp. 461-465, vol. 31.

Jeong, C. W. et al., "Switching Current Scaling and Reliability Evaluation in PRAM," IEEE Non-Volatile Semiconductor Memory Workshop, Monterey, CA 2004, pp. 28-29 and workshop cover sheet.

Kim, Kinam et al., "Reliability Investigations for Manufacturable High Density PRAM," IEEE 43rd Annual International Reliability Physics Symposium, San Jose, 2005, pp. 157-162.

Kojima, Rie et al., "Ge-Sn-Sb-Te Phase-change Recording Material Having High Crystallization Speed," Proceedings of PCOS 2000, pp. 36-41.

Lacita, A. L., "Electrothermal and Phase-change Dynamics in Chalcogenide-based Memories," IEEE IEDM 2004, 4 pp.

Lai, Stefan, "Current Status of the Phase Change Memory and Its Future," IEEE IEDM 2003, pp. 255-258.

Lai, Stephan et al., "OUM-A 180 nm Nonvolatile Memory Cell Element Technology for Stand Alone and Embedded Applications," IEEE IEDM 2001, pp. 803-806.

Mott, Nevill, "Electrons in Glass," Nobel Lecture, Dec. 8, 1977, Physics, 1977, pp. 403-413.

Ovonyx Non-Confidential paper entitled "Ovonic Unified Memory," Dec. 1999, pp. 1-80.

Ovshinsky, Sandford R., "Reversible Electrical Switching Phenomena in Disordered Structures," Physical Review Letters, vol. 21, No. 20, Nov. 11, 1968, pp. 1450-1453.

Owen, Alan E. et al., "Electronic Conduction and Switching in Chalcogenide Glasses," IEEE Transactions on Electron Devices, vol. Ed. 20, No. 2, Feb. 1973, pp. 105-122.

Pellizer, F. et al.,"Novel u Trench Phase-Change Memory Cell for Embedded and Stand-Alone Non-Volatile Memory Applications," 2004 Symposium on VLSI Technology Digest of Technical Papers, pp. 18-19.

Pirovano, Agostino et al.,"Reliability Study of Phase-Change Nonvolatile Memories," IEEE Transactions on Device and Materials Reliability, Sep. 2004, pp. 422-427, vol. 4, No. 3.

Pirovano, Agostino, et al., "Low-Field Amorphous State Resistance and Threshold Voltage Drift in Chalcogenide Materials," IEEE Transactions on Electron Devices, vol. 51, No. 5, May 2004, 6 pages.

Prakash, S. et al., "A guideline for Designing Chalcogenide-Based Glasses for Threshold Switching Characteristics," IEEE Electron Device Letters, vol. 18, No. 2, Feb. 1997, pp. 45-47.

Radaelli, A. et al., "Electronic Switching Effect and Phase-Change Transition in Chalcogenide Materials," IEEE Electron Device Letters, Oct. 2004, pp. 684-686, vol. 25, No. 10.

Rochefort, C. et al., "Manufacturing of High Aspect-Ration p-n Junctions Using Vapor Phase Doping for Application in Multi-Resurf Devices," IEEE 2002, pp. 237-240.

Schafft, Harry A. et al., "Thermal Conductivity Measurements of Thin Films Silicon Dioxide," Proceedings of the IEEE 1989 International Conference on Microelectronic Test Structures vol. 2, No. 1, Mar. 1989, pp. 121-124.

Strauss, Karl F. et al., "Overview of Radiation Tolerant Unlimited Write Cycle Non-Volatile Memory," IEEE 2000, pp. 399-408.

Subramanian, Vivek et al., "Low Leakage Germanium-Seeded Laterally-Crystallized Single-Grain 100-nm TFT's for Vertical Integration Applications," IEEE Electron Device Letters, vol. 20, No. 7, Jul. 1999, pp. 341-343.

Wicker, Guy et al., Nonvolatile, High Density, High Performance Phase Change Memory, 1999, http://klabs.org/richcontent/MAPLDCon99/Papers/P21_Tyson_P.PDF#search='nonvolatile%20high%20density%20high%20performance%20phase%20change%20memory', 8pages.

Wicker, Guy, "A Comprehensive Model of Submicron Chalcogenide Switching Devices," Doctoral Dissertation, Wayne State University, Detroit, MI 1996, 137 pp.

Wolf, Stanley, Excerpt from: Silicon Processing for the VLSI Era—vol. 4, pp. 674-679, 2004.

Wuttig, Matthias, "Towards a Universal Memory?" Nature Materials, Apr. 2005, pp. 265-266, vol. 4.

Yamada, Noboru, "Potential of Ge-Sb-Te phase-change optical disks for high-data-rate recording in the near future," (Conference Proceedings Paper), Jul. 30, 1997, vol. 3109, 10 pages.

Yi, J. H. et al., "Novel Cell Structure of PRAM with Thin Metal Layer Inserted GeSbTe," IEEE IEDM 2003, 4 pages.

Yonehara, T. et al., "Control of Grain Boundary Location by Selective Nucleation Over Amorphous Substrates," Mat. Res. Soc. Symp. Proc., vol. 106, 1998, pp. 21-26.

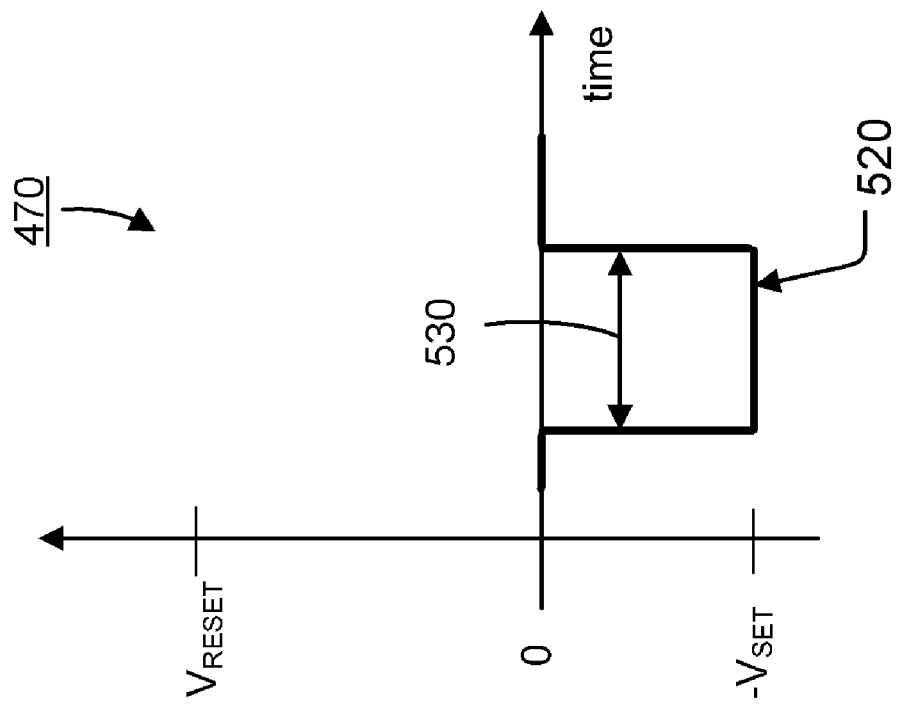
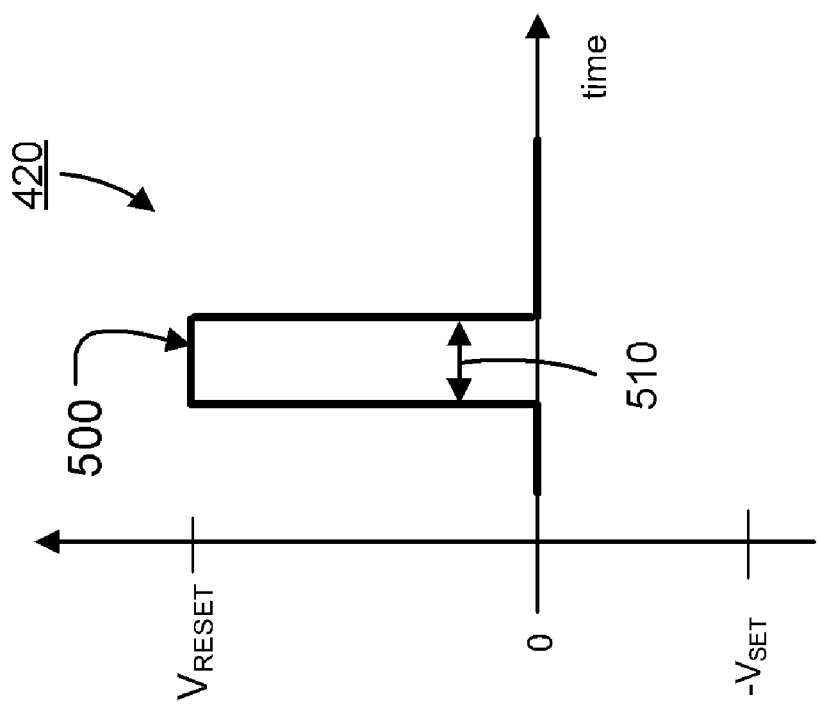
Fig. 5A
Fig. 5B

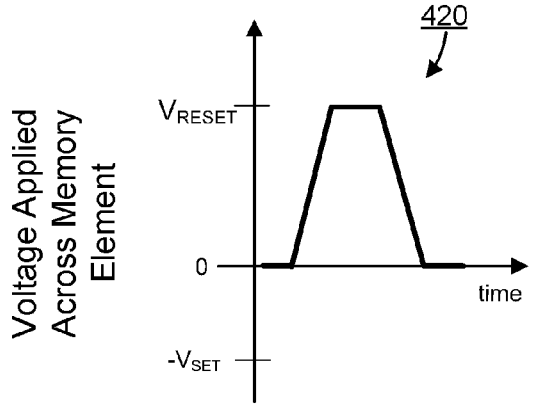
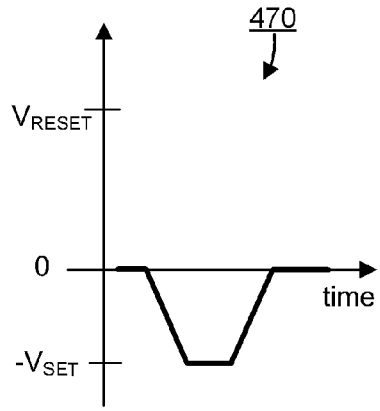
Fig. 7A   Fig. 7B
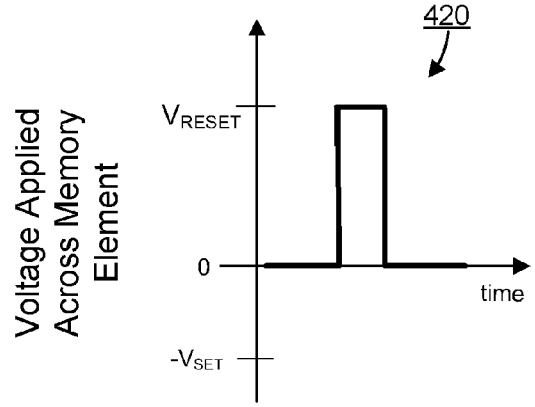
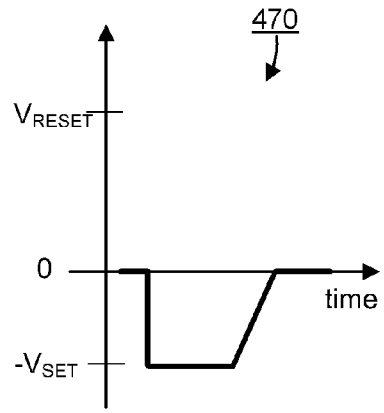
Fig. 8A   Fig. 8B
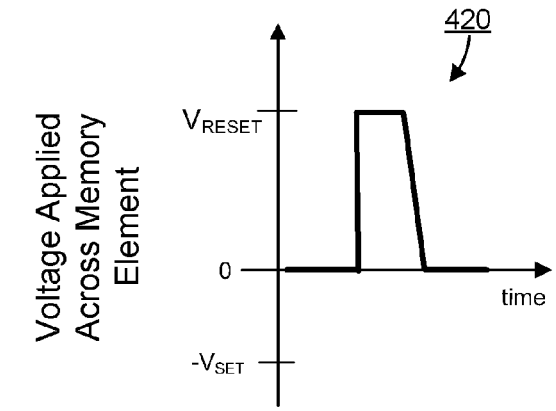
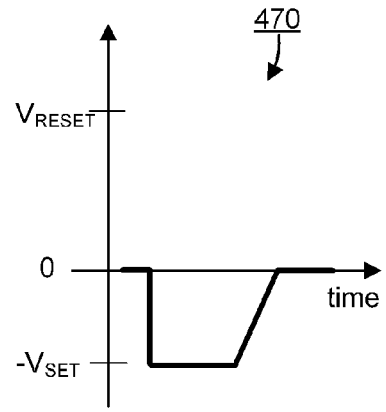
Fig. 9A   Fig. 9B

Pulse Width of Set Pulse varies from 40 ns to 3000 ns

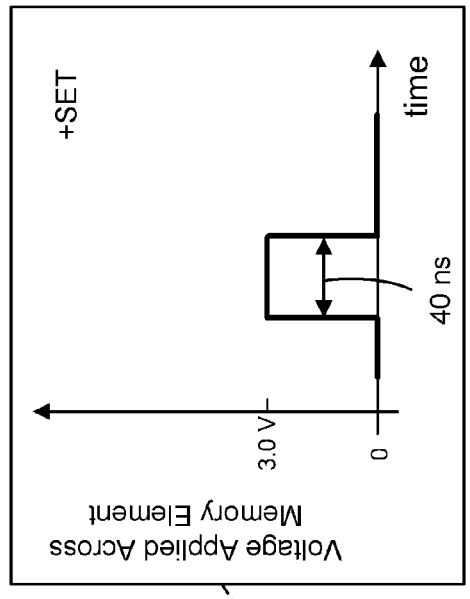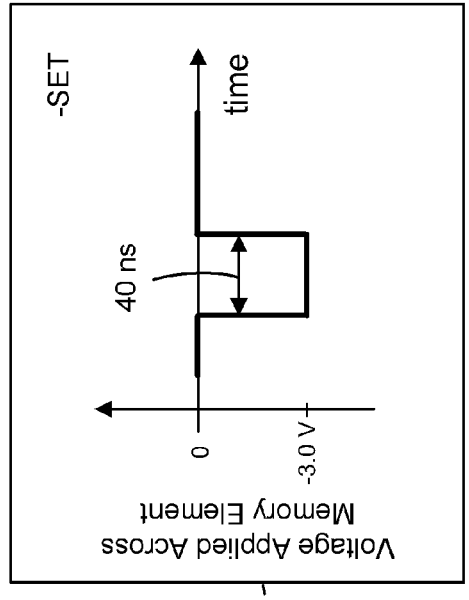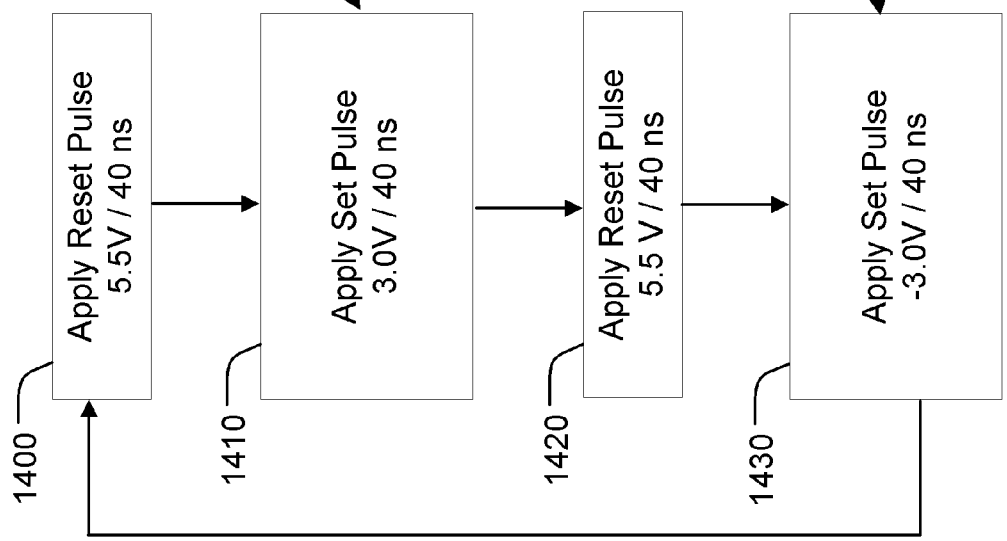

BIPOLAR SWITCHING OF PHASE CHANGE DEVICE

CROSS-REFERENCE TO RELATED APPLICATIONS

This application claims the benefit of U.S. Provisional Patent Application No. 61/051,327 titled "Bipolar Switching of Phase Change Device" filed on 7 May 2008, which is incorporated by reference herein.

This application is related to U.S. patent application Ser. No. 12/466,650 entitled "Methods for High Speed Reading Operation of Phase Change Memory and Device Employing Same", filed on 15 May 2009.

BACKGROUND OF THE INVENTION

1. Field of the Invention

The present invention relates to memory devices based on phase change based memory materials, including chalcogenide based materials and on other programmable resistive materials, and methods for operating such devices.

2. Description of Related Art

Phase change based memory materials, like chalcogenide based materials and similar materials, can be caused to change phase between an amorphous state and a crystalline state by application of electrical current at levels suitable for implementation in integrated circuits. The generally amorphous state is characterized by higher electrical resistivity than the generally crystalline state, which can be readily sensed to indicate data. These properties have generated interest in using programmable resistive material to form nonvolatile memory circuits, which can be read and written with random access.

In phase change memory, data is stored by causing transitions in an active region of the phase change material between amorphous and crystalline phases. FIG. 1 is an example distribution of the resistance for a number of memory cells each comprising a phase change memory element. The phase change memory elements of the memory cells are programmable to a plurality of resistance states including a high resistance reset (erased) state 102 and at least one lower resistance set(programmed) state 100. Each resistance state corresponds to a non-overlapping resistance range.

The difference between the highest resistance $R_1$ of the lower resistance state 100 and the lowest resistance $R_2$ of the high resistance reset state 102 defines a read margin 101 used to distinguish cells in the lower resistance state 100 from those in the high resistance state 102. The data stored in a memory cell can be determined by determining whether the memory cell has a resistance corresponding to the lower resistance state 100 or to the high resistance state 102, for example by measuring whether the resistance of the memory cell is above or below a threshold resistance value $R_{SA}$ 103 within the read margin 101.

The change from the high resistance state 102 to the lower resistance state 100, referred to as set (or program) herein, is generally a lower current operation in which current heats the phase change material above a transition temperature to cause transition from the amorphous to the crystalline phase. The change from lower resistance state 100 to the high resistance state 102, referred to as reset herein, is generally a higher current operation, which includes a short high current density pulse to melt or breakdown the crystalline structure, after which the phase change material cools quickly, quenching the phase change process and allowing at least a portion of the phase change material to stabilize in the amorphous phase.

The magnitude of the current needed for reset can be reduced by reducing the size of the phase change memory element so that higher current densities are achieved with small absolute current values through the phase change memory element. However, reducing the size of the phase change memory element can result in a "difficult to set" phenomenon. Specifically, it can be become difficult to cause an active region of the phase change material to transition from the amorphous phase of the high resistance state 102 to the crystalline phase of the lower resistance state 100.

It is therefore desirable to provide methods for operating memory devices characterized by the difficult to set behavior.

SUMMARY OF THE INVENTION

A method is described herein for operating a memory cell comprising a phase change memory element programmable to a plurality of resistance states including a higher resistance state and a lower resistance state. The method comprises applying a reset bias arrangement to the memory cell to change the resistance state from the lower resistance state to the higher resistance state. The reset bias arrangement comprises a first voltage pulse. The method further comprises applying a set bias arrangement to the memory cell to change the resistance state from the higher resistance state to the lower resistance state. The set bias arrangement comprises a second voltage pulse, the second voltage pulse having a voltage polarity different from that of the first voltage pulse.

A memory device as described herein comprises a memory cell comprising a phase change memory element programmable to a plurality of resistance states including a higher resistance state and a lower resistance state. The memory device further comprises bias circuitry to apply a set bias arrangement and a reset bias arrangement as described above.

The operations described herein comprising set and reset bias arrangements having opposite polarity pulses have been demonstrated to overcome the "difficult to set" behavior of memory cell structures such as small bridge-type memory cells which suffer significant thermoelectric effects that cause asymmetrical heating in the body of the phase change material. Representative configurations suffering this "difficult to set" behavior have an active region with a heating zone during a set operation which is spaced away from electrodes contacting the phase change material.

In embodiments the second voltage pulse of the set bias arrangement has a pulse width of 60 ns or less. As a result, the phase change memory devices and methods for operating described herein overcome the slow set behavior commonly associated with phase change memory devices, and extend their usefulness into high speed applications such as DRAM which require a set pulse width less than or equal to 60 ns.

Other aspects and advantages of the present invention can be seen on review of the drawings, the detailed description, and the claims which follow.

BRIEF DESCRIPTION OF THE DRAWINGS

FIGS. 5A and 5B illustrate a first embodiment of a timing diagram of the reset and set operations of FIGS. 4A and 4B.

FIGS. 7A-7B, 8A-8B, and 9A-9B illustrate alternative embodiments of the timing diagrams of the reset and set operations of FIGS. 4A and 4B.

FIG. 14A is a flow diagram of an operational sequence applied to the memory cell of FIG. 10.

FIG. 14B is a simplified timing diagram of step 1410 of the operational sequence of FIG. 14A.

FIG. 14C is a simplified timing diagram of step 1430 of the operational sequence of FIG. 14A.

DETAILED DESCRIPTION

Figure 1:
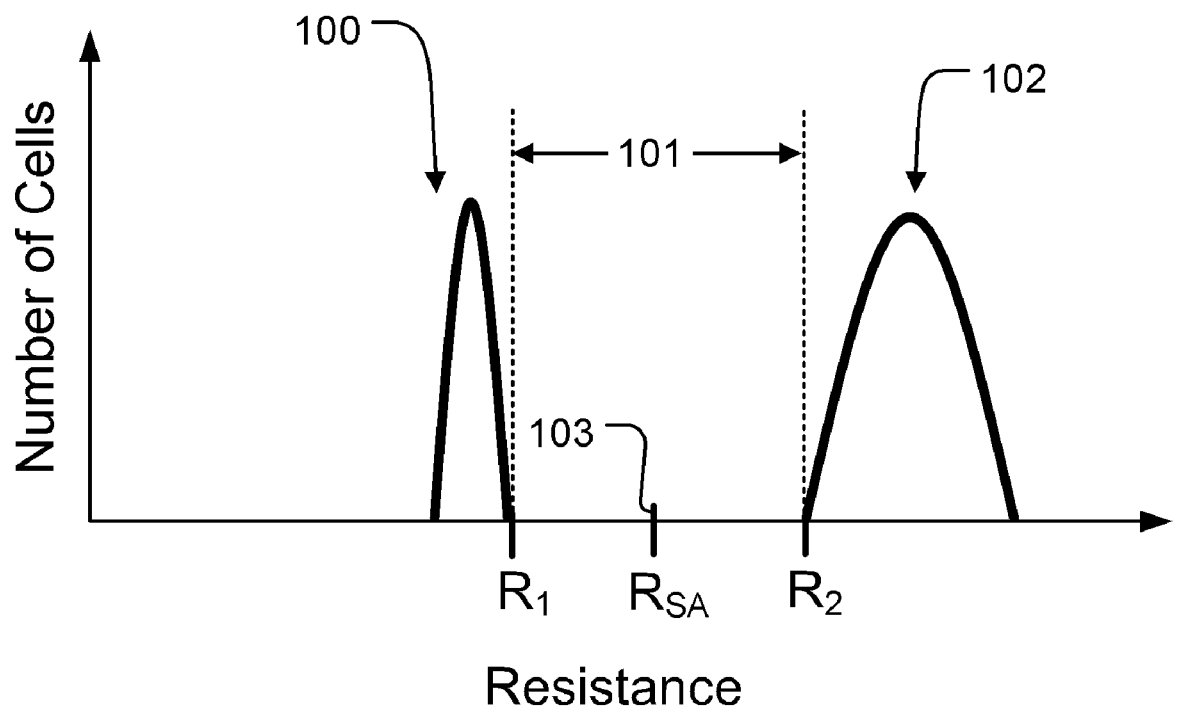
FIG. 1 is an example distribution of the resistance of a number of memory cells each comprising a phase change memory element programmable to a high resistance state and a low resistance state.

The following description of the disclosure will typically be with reference to specific structural embodiments and methods. It is to be understood that there is no intention to limit the disclosure to the specifically disclosed embodiments and methods, but that the disclosure may be practiced using other features, elements, methods and embodiments. Preferred embodiments are described to illustrate the present disclosure, not to limit its scope, which is defined by the claims. Those of ordinary skill in the art will recognize a variety of equivalent variations on the description that follows. Like elements in various embodiments are commonly referred to with like reference numerals.

As mentioned above, as the size of the phase change memory element is reduced it can become more and more difficult to cause a transition to the lower resistance state 100.

FIGS. 2A-2D show representative prior art memory cell structures for which the bipolar operations described herein can be applied to overcome the "difficult to set" characteristic of very small devices. The representative memory cell structures of FIGS. 2A-2D suffering this "difficult to set" behavior have an active region 218 with a heating zone during a set operation which is spaced away from the electrodes contacting the phase change material, as is discussed in more detail below.

Figure 2A:
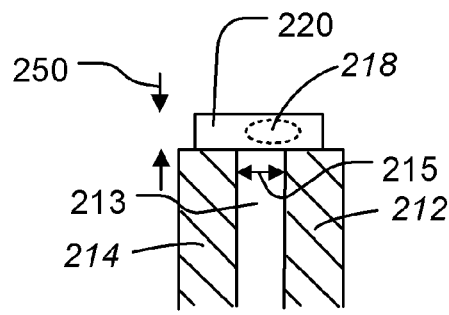
FIGS. 2A-2D show prior art memory cell structures for which the operations described herein can be applied to overcome the "difficult to set" behavior of very small devices.

FIG. 2A is a simplified cross-sectional view of a "bridge-type" memory cell 200 illustrating a first configuration for memory element 220 coupled to first and second electrodes 212, 214. The first electrode 212 may, for example, be coupled to a terminal of an access device such as a transistor, while the second electrode 214 may be coupled to a bit line.

A dielectric spacer 213 having a width 215 separates the first and second electrodes 212, 214. The phase change material of memory element 220 has a thickness 250 and extends across the dielectric spacer 213 to contacts the first and second electrodes 212, 214, thereby defining an inter-electrode path between the first and second electrodes 212, 214 having a path length defined by the width 215 of the dielectric spacer 213. In operation, as current passes between the first and second electrodes 212, 214 and through the memory element 220, the active region 218 of the phase change material of the memory element 220 heats up more quickly than the remainder of the memory element 220.

Figure 2B:
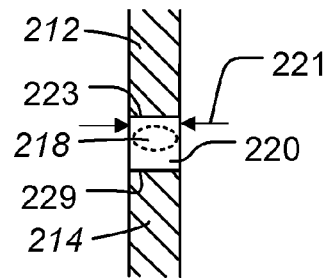

FIG. 2B is a simplified cross-sectional view of a "pillar-type" memory cell illustrating a second configuration having a pillar shaped memory element 220 surrounded by a dielectric and coupled to first and second electrodes 212, 214. The phase change material of the memory element 220 has an active region 218 and contacts the first and second electrodes 212, 214 at top and bottom surfaces 223, 229 respectively. The memory element 220 has a width (which in some embodiments is a diameter) 221 the same as that of the first and second electrodes 212, 214.

Figure 2C:
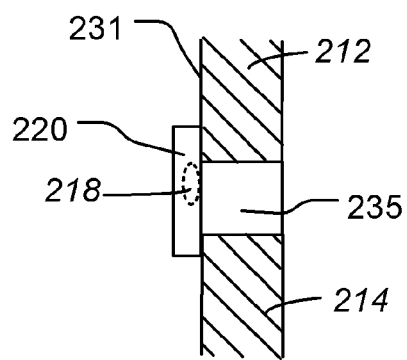

FIG. 2C is a simplified cross-sectional view of a "sidewall-type" memory cell illustrating a third configuration for memory element 220 coupled to first and second electrodes 212, 214, the phase change material of memory element 220 having an active region 218. The first and second electrodes 212, 214 are separated by dielectric spacer 235. The first and second electrodes 212, 214 and the dielectric spacer 235 have a sidewall surface 231. The phase change material of memory element 220 is on the sidewall surface 231 and extends across the dielectric spacer 235 to contact the first and second electrodes 212, 214.

Figure 2D:
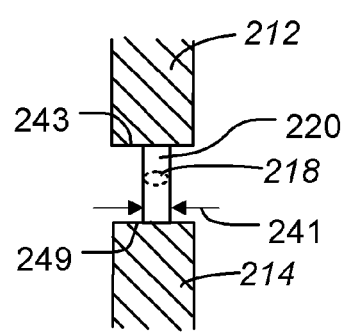

FIG. 2D is a simplified cross-sectional view of a "pore-type" memory cell illustrating a fourth configuration for memory element 220 surrounded by a dielectric and coupled to first and second electrodes 212, 214. The phase change material of memory element 220 has an active region 218 and contacts the first and second electrodes 212, 214 at top and bottom surfaces 243, 249 respectively. The memory element 220 has a width (which in some embodiments is a diameter) 241 less than that of the first and second electrodes 212, 214.

Reading or writing to the memory cell 200 can be achieved by applying appropriate bias arrangements across the memory element 220. The bias arrangements comprise applying pulses to one or both of the first and second electrodes 212, 214 to induce current through the memory element 220. The levels and durations of the pulses applied are dependent upon the operation performed (e.g. a read operation or a programming operation) and can be determined empirically for each embodiment. The bias arrangements may include pulses having a positive voltage from the second electrode 214 to the first electrode 212 (referred to herein as a positive voltage across the memory element 220), and/or may include pulses having a negative voltage from the second electrode 214 to the first electrode 212 (referred to herein as a negative voltage across the memory element 220).

In a read (or sense) operation of the memory cell 200, bias circuitry coupled to the first and second electrodes 212, 214 applies a read bias arrangement across the memory element 220 of suitable amplitude and duration to induce current to flow which does not result in the memory element 220 undergoing a change in resistive state. The current through the memory element 220 is dependent upon the resistance of the memory element 220. Thus, the current through the memory element 220 indicates the data value stored in the memory cell 200.

In a reset (or erase) operation of the memory cell 200, bias circuitry coupled to the first and second electrodes 212, 214 applies a reset bias arrangement of suitable amplitude and duration to induce a current to flow through the memory element 220, thereby raising the temperature of at least the active region above the transition (crystallization) temperature of the phase change material of the memory element 220 and also above the melting temperature to place at least the active region 218 in a liquid state. The current is then terminated, for example by terminating voltage pulses applied to the first and second electrodes 212, 214, resulting in a relatively quick quenching time as the active region 218 rapidly cools to stabilize to an amorphous phase.

In a set (or erase) operation of the memory cell 200, bias circuitry coupled to the first and second electrodes 212, 214 applies a set bias arrangement of suitable amplitude and duration to induce a current to flow through the memory element 220, thereby raising the temperature of at least a portion of the active region 218 above the transition temperature and cause a transition of at least a portion of the active region 218 from the amorphous phase to the crystalline phase, this transition lowering the resistance of the memory element 2209 and setting the memory cell 200 to the desired state.

As the size of the phase change memory element 220 is reduced it can become more and more difficult to cause the active region 218 to transition from the amorphous phase of the high resistance state to the crystalline phase of the lower resistance state. As discussed below with reference to FIG. 3, it is theorized that the "difficult to set" behavior is due to significant thermoelectric effects such as the Thomson effect which result in asymmetric heating of the phase change material.

Figure 3:
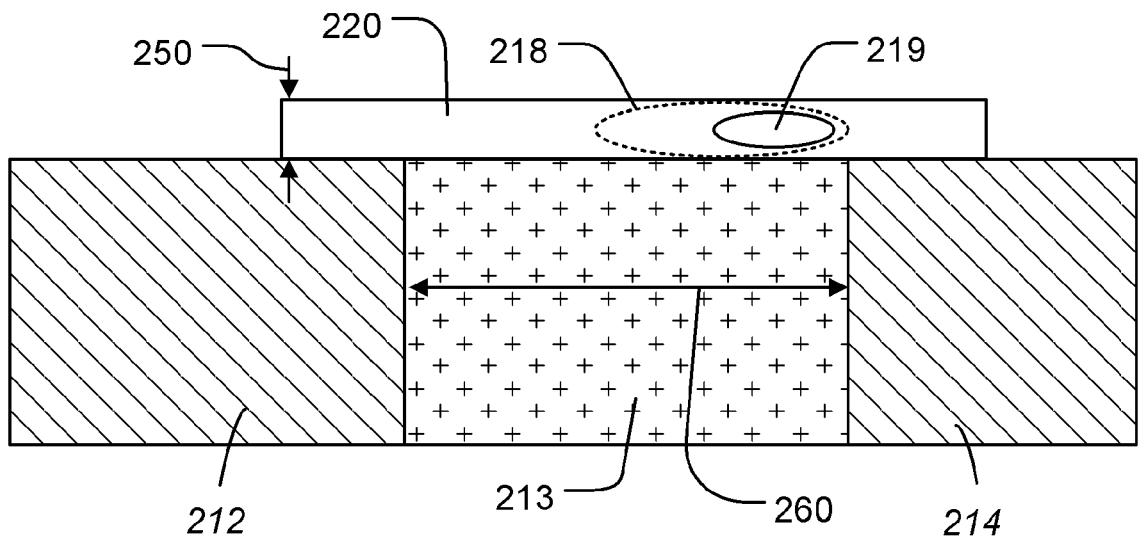
FIG. 3 is a cross-sectional view of a bridge type memory cell having asymmetric heating along the current path through the memory element.

Illustrated in FIG. 3 is a bridge type memory cell 300 having first and second electrodes 212, 214 and a phase change memory element 220 extending across a dielectric spacer 213 to contact the electrodes 212, 214. The phase change memory element 220 defines an inter-electrode path between the first and second electrodes having an inter-electrode path length defined by the width 260 of the dielectric spacer 213. In operation, asymmetric heating along the current path between the electrodes 212, 214 results in an amorphous active region 218 in the higher resistance reset state that is closer to one electrode 214 than the other electrode 212.

During a set operation, heating takes place within the amorphous active region 218 since the resistance in the amorphous phase is higher than that in the crystalline phase. Due to the asymmetric heating, applying a set pulse of the same voltage polarity as a reset pulse results in an asymmetric heating zone 219 where heating takes place within the amorphous active region 218. As shown in FIG. 3, the heating zone 219 is closer to the second electrode 214.

The relatively high thermal conductivity of the electrode 214 acts to draw heat away from the heating zone 219 of the active region 218, resulting in a significant amount of heat loss during a set operation. The asymmetric heating zone 219 and high heat loss results in insufficient heating to cause a transition of the active region 218 into the low resistance crystalline phase, resulting in the "difficult to set" behavior.

Figure 4A:
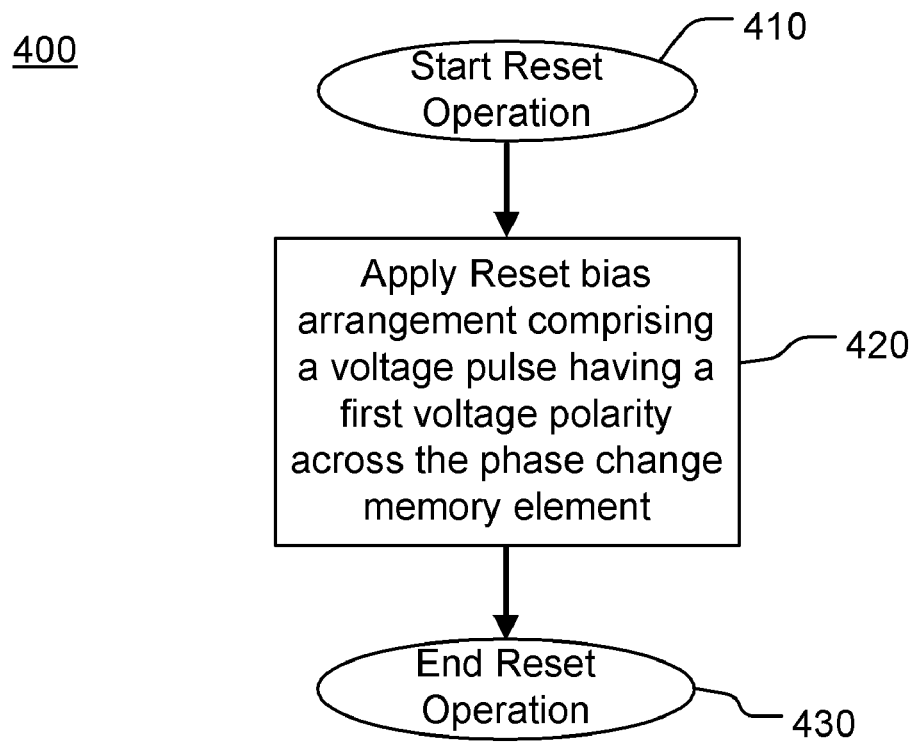
FIGS. 4A and 4B are flow diagrams of a reset and a set operation respectively which can overcome the "difficult to set" behavior.
Figure 4B:
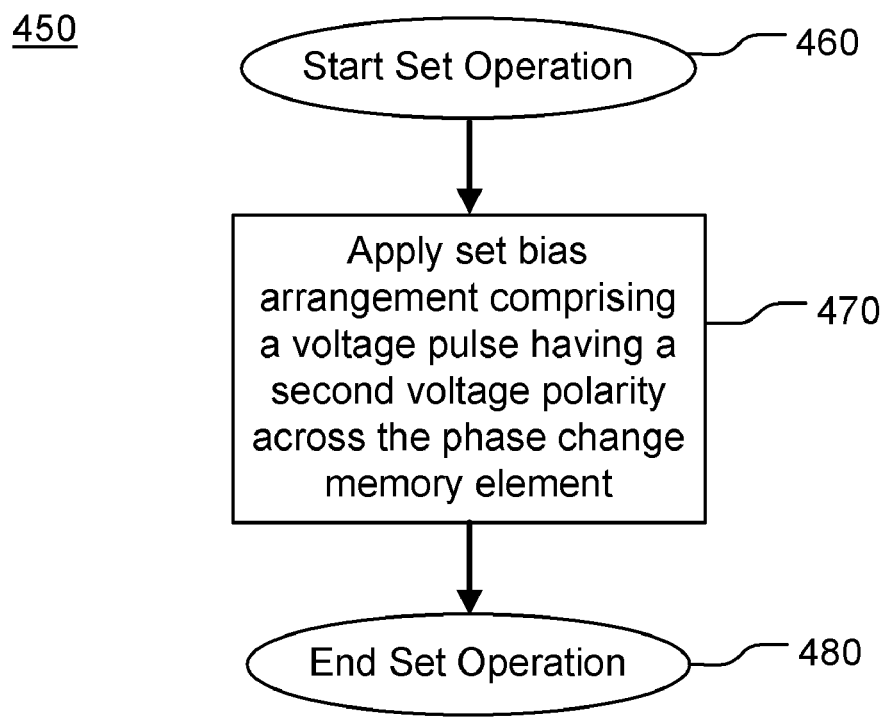

FIGS. 4A-4B are flow diagrams of a reset operation 400 and a set operation 450 respectively which can overcome the "difficult to set" characteristic of programming the memory element 220. FIG. 4A is a flow diagram of a reset operation 400 for programming the memory element 220 from the lower resistance state 100 to the higher resistance state 102. FIG. 4B is a flow diagram of a set operation 450 for programming the memory element 220 from the higher resistance state 102 to the lower resistance state 100.

FIGS. 5A-5B illustrate a first embodiment of a timing diagram of the reset and set operations 400,450 of FIGS. 4A-4B. As will be understood, the timing diagram of FIGS. 5A-5B are simplified and not necessarily to scale.

The reset operation 400 of the memory cell 200 begins at step 410 of FIG. 4A. Step 410 may include, or in some embodiments be preceded by, a read operation to determine if the memory cell 200 needs to be programmed by the reset operation 400.

Next, at step 420 a reset bias arrangement comprising a voltage pulse having a first voltage polarity across the memory element 220 is applied to the memory cell 200. The voltage pulse having a first voltage polarity of step 420 can be applied across the memory element 220 by changing the voltage applied to one electrode or changing the voltages applied to both of the first and second electrodes 212, 214.

In the illustrated embodiment of FIG. 5A, the reset bias arrangement of step 420 comprises voltage pulse 500 having a pulse height $V_{RESET}$ and a pulse width 510 across the memory element 220, and has a positive voltage polarity from the second electrode 214 to the first electrode 212.

The voltage pulse 500 induces current to flow from the second electrode 214 through the memory element 220 to the first electrode 212. The current is sufficient to raise the temperature of at least the active region 218 above the transition temperature and also above the melting temperature to place at least the active region 218 in a liquid state. The current is then terminated by the falling edge of the voltage pulse 500, allowing the active region 218 to rapidly cool and stabilize to an amorphous phase, thereby establishing the higher resistance state 102. The reset operation then ends at step 430.

The set operation 450 of the memory cell 200 begins at step 460 of FIG. 4B. Step 460 may include, or in some embodiments be preceded by, a read operation to determine if the memory cell needs to be programmed by the set operation 460.

Next, at step 470 a set bias arrangement comprising a voltage pulse having a second voltage polarity across the memory element 220 is applied to the memory cell 200. The second voltage polarity is opposite the first voltage polarity of the voltage pulse of the step 420 of the reset operation 400. The voltage pulse having a second voltage polarity of step 470 can be applied across the memory element 220 by changing the voltage applied to one electrode or changing the voltages applied to both of the first and second electrodes 212, 214.

In the illustrated embodiment of FIG. 5B, the set bias arrangement of step 470 comprises voltage pulse 520 having a pulse height $V_{SET}$ and a pulse width 530 across the memory element, and has a negative voltage polarity from the second electrode 214 to the first electrode 212

The voltage pulse 520 induces current to flow from the first electrode 212 through the memory element 220 to the second electrode 214. The current is sufficient to raise the temperature of the active region 218 above the transition temperature (crystallization) temperature of the phase change material to cause a transition of the active region 218 into a crystalline phase, thereby establishing the lower resistance state 100. The set operation then ends at step 480.

In embodiments the voltage pulse 520 of the set bias arrangement of step 470 can have a pulse width 530 less than or equal to 60 ns. As a result, the phase change memory devices and methods for operating described herein overcome the slow set behavior commonly associated with phase change memory devices, and extend their usefulness into high speed applications such as DRAM which require a set pulse width less than or equal to 60 ns.

In the illustrated embodiment of FIGS. 5A-5B, the voltage pulse 500 has a positive voltage polarity from the second electrode 214 to the first electrode 212 and the voltage pulse 520 has a negative voltage polarity from the second electrode 214 to the first electrode 212. In an alternative embodiment, the voltage pulse 500 has a negative voltage polarity from the second electrode 214 to the first electrode 212 and the voltage pulse 520 has a positive voltage polarity from the second electrode 214 to the first electrode 212.

As was described above, the set operation 450 of FIG. 4B induces current to flow through the memory element 220 opposite that of the reset operation 400 of FIG. 4A. Since current flows in both directions through the memory element 220 during operation, the reset and set operations 400, 450 can compensate for the asymmetrical heating caused by thermo-electric effects such as the Thomson effect. This is explained in more detail below with reference to FIG. 6.

Figure 6:
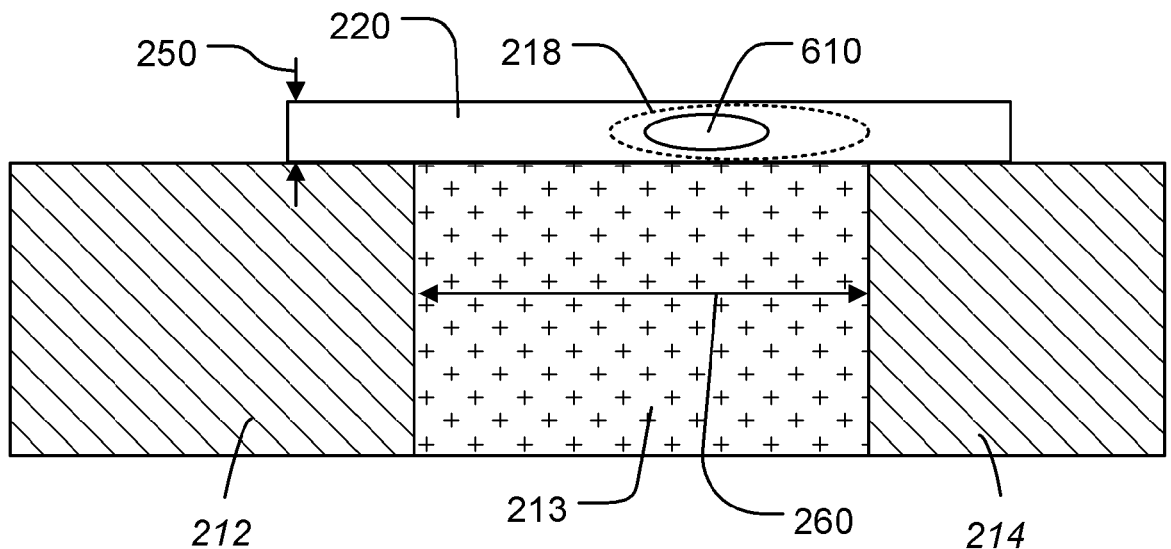
FIG. 6 is a cross-sectional view of a bridge type memory cell including a heating zone which is closer to the middle of the device than that of the device of FIG. 3.

Illustrated in FIG. 6 is a bridge type memory cell 600 like that of FIG. 3. The reset operation 400 induces a reset current from the second electrode 214 to the first electrode 212. As is shown in FIG. 6, the asymmetric heating caused by thermo-electric effects such as the Thompson Effect during reset results in the active region 218 being closer to the second electrode 214 than the first electrode 212. The direction of current flow in the reset operation 400 thus defines the asymmetrical location of the active region 218, and is therefore used to determine the direction of current flow for the set operation 450.

The set operation 450 induces a set current from the first electrode 212 to the second electrode 214. Due to the asymmetric heating, the heating zone 610 where heating takes place during set is within a portion of the active region 218 which is closer to the first electrode 212 than the second electrode 214. Thus the heating zone 610 is closer to the middle of the device than the heating zone 219 of FIG. 3. This results in sufficient heating efficiency to cause a transition of the active region 218 into the crystalline phase, thereby establishing the lower resistance state.

FIGS. 7A-7B, 8A-8B, and 9A-9B illustrate some examples of the pulses of the bias arrangements of the steps 420 and 470 that may be used in some alternative embodiments.

In the illustrated embodiments of FIGS. 5-9, the bias arrangements of steps 420 and 470 each comprise a single voltage pulse. More generally, the bias arrangements of steps 420 and 470 may each comprise one or more pulses applied across the memory element 220. In the operating methods described herein at least one pulse of the reset bias arrangement of step 420 has a voltage polarity across the memory element opposite that of at least one pulse of the set bias arrangement of step 470. In some embodiments, each pulse of the reset bias arrangement of step 420 has a voltage polarity across the memory element opposite that of each pulse of the set bias arrangement of step 470. The number of pulses and the pulse shapes, including the pulse heights and pulse widths, of each of the bias arrangements can be determined empirically for each embodiment.

Figure 10:
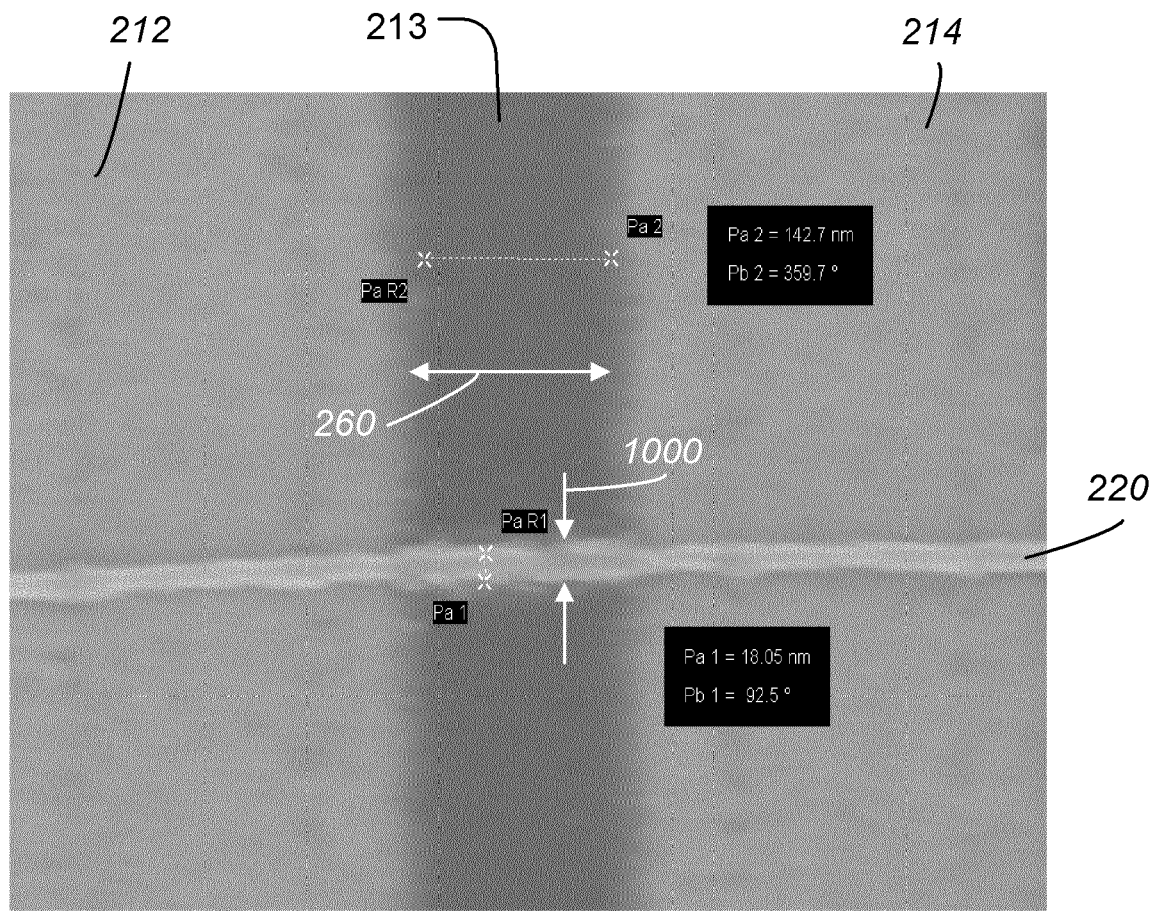
FIG. 10 is an SEM image of a bridge type memory cell.

FIG. 10 is an SEM image of a top view of a bridge type memory cell including memory element 220 comprising $Ge_2Sb_2Te_5$ and doped with about 1.7 at % Ti, about 16.6 at % N, and about 13.7 at % Fe. In FIG. 6, the memory element 220 has a length 260 between electrodes 212 and 214 of about 140 nm, has a width 1000 of about 20 nm, and a thickness of about 5 nm. In the measured results presented herein, bridge type memory cells having widths of about 20 and 50 nm, a thickness of 5 nm, and lengths of 50 nm and up were built and tested.

Measured results discussed below with respect to FIGS. 11A-11E and 12A-12B show the difficulty in setting the memory cell to the lower resistance state using set and reset operations of the same voltage polarity. Thus, the memory cell of FIG. 10 is characterized as "difficult to set".

Figure 11B:
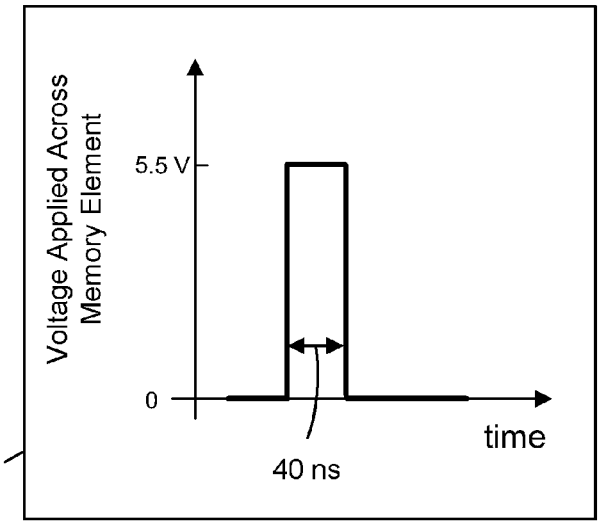
FIG. 11B is a simplified timing diagram of step 1100 of the operational sequence of FIG. 11A.
Figure 11A:
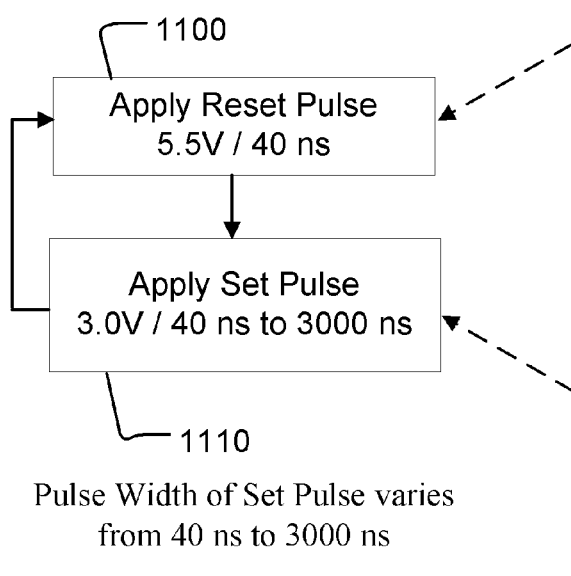
FIG. 11A is a flow diagram of an operational sequence applied to the bridge type memory cell of FIG. 10.
Figure 11C:
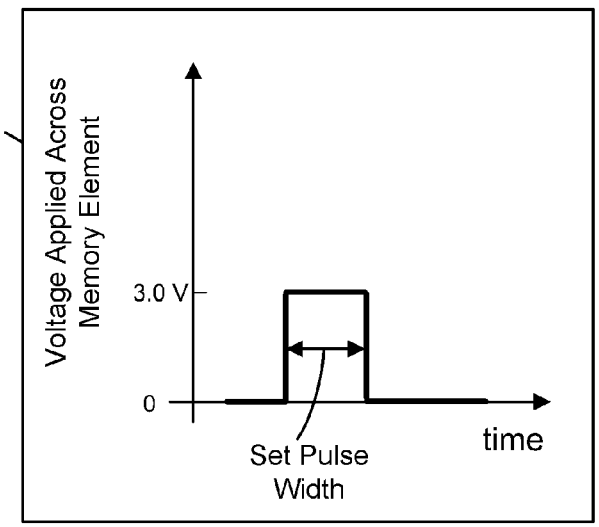
FIG. 11C is a simplified timing diagram of step 1110 of the operational sequence of FIG. 11A.

FIG. 11A is a flow diagram of an operational sequence applied to the bridge type memory cell of FIG. 10 with a memory element 220 having width of about 50 nm and a length of about 50 nm.

The sequence begins at step 1100 by applying a reset pulse of 5.5 V having a pulse width of 40 ns across the memory element 220. The rise and fall times of the pulse were set to be as small as practical. Due to instrument limitations, the rise and fall times were actually about 2 ns each in the measured results. The reset pulse of step 1100 is shown in the simplified timing diagram of FIG. 11B.

Next, at step 1110 a set pulse of 3.0 V of the same voltage polarity as the reset pulse of step 1100 is applied across the memory element 220. The rise and fall times of the pulse were set to be as small as practical. Due to instrument limitations, the rise and fall times were actually about 2 ns each in the measured results. As represented by the arrow from step 1110 to step 1100, the sequence then returns to step 1100. The pulse width of the set pulse of step 1110 begins at 40 ns for the first application of step 1110. The pulse width of the set pulse is stepped up for each successive operation of block 1110 up to 3000 ns.

Figure 11D:
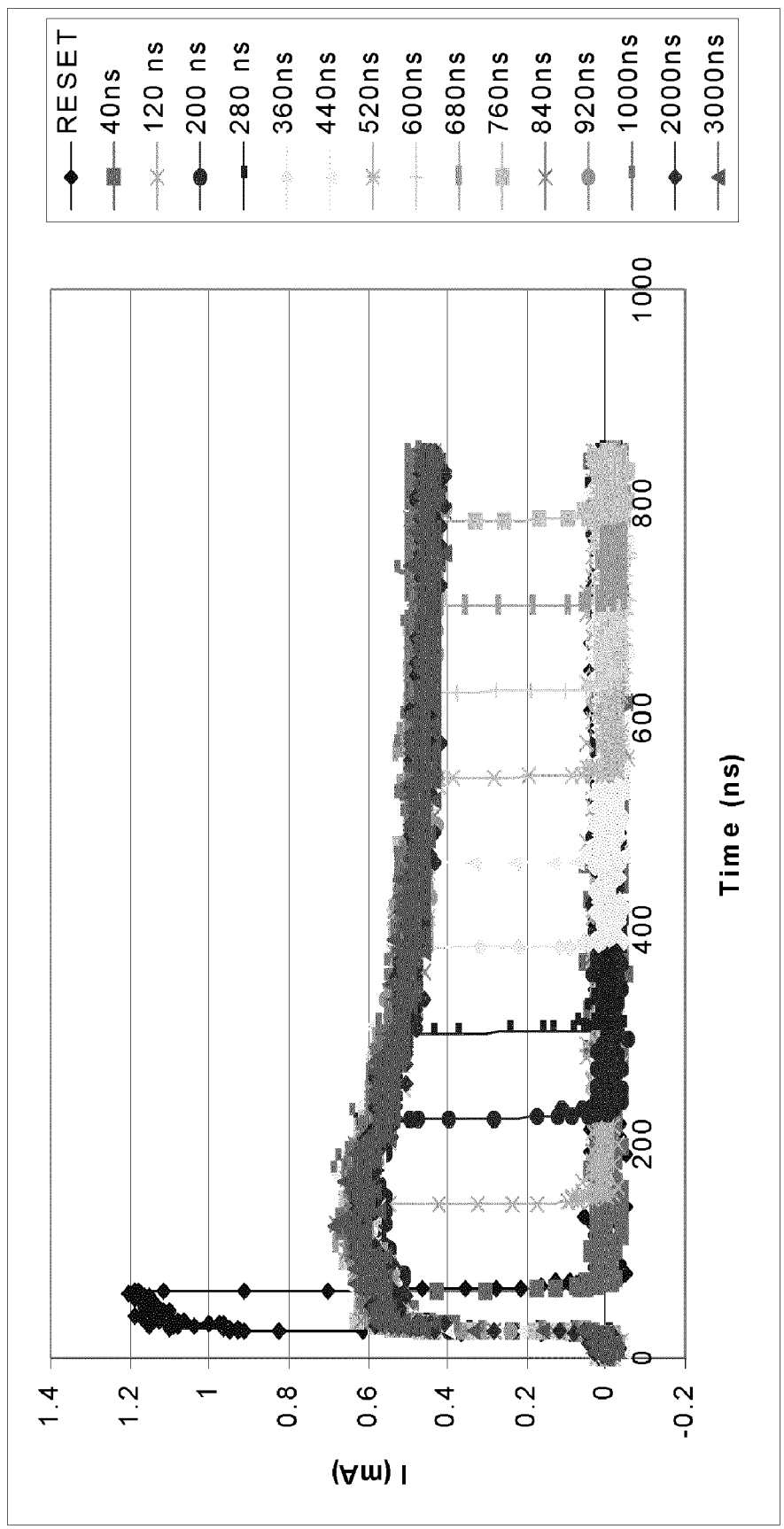
FIG. 11D is the measured current through the memory element for the various steps of the sequence of FIG. 11A.

FIG. 11D is the measured current through the memory element for the various steps of the sequence of FIG. 11A.

Figure 11E:
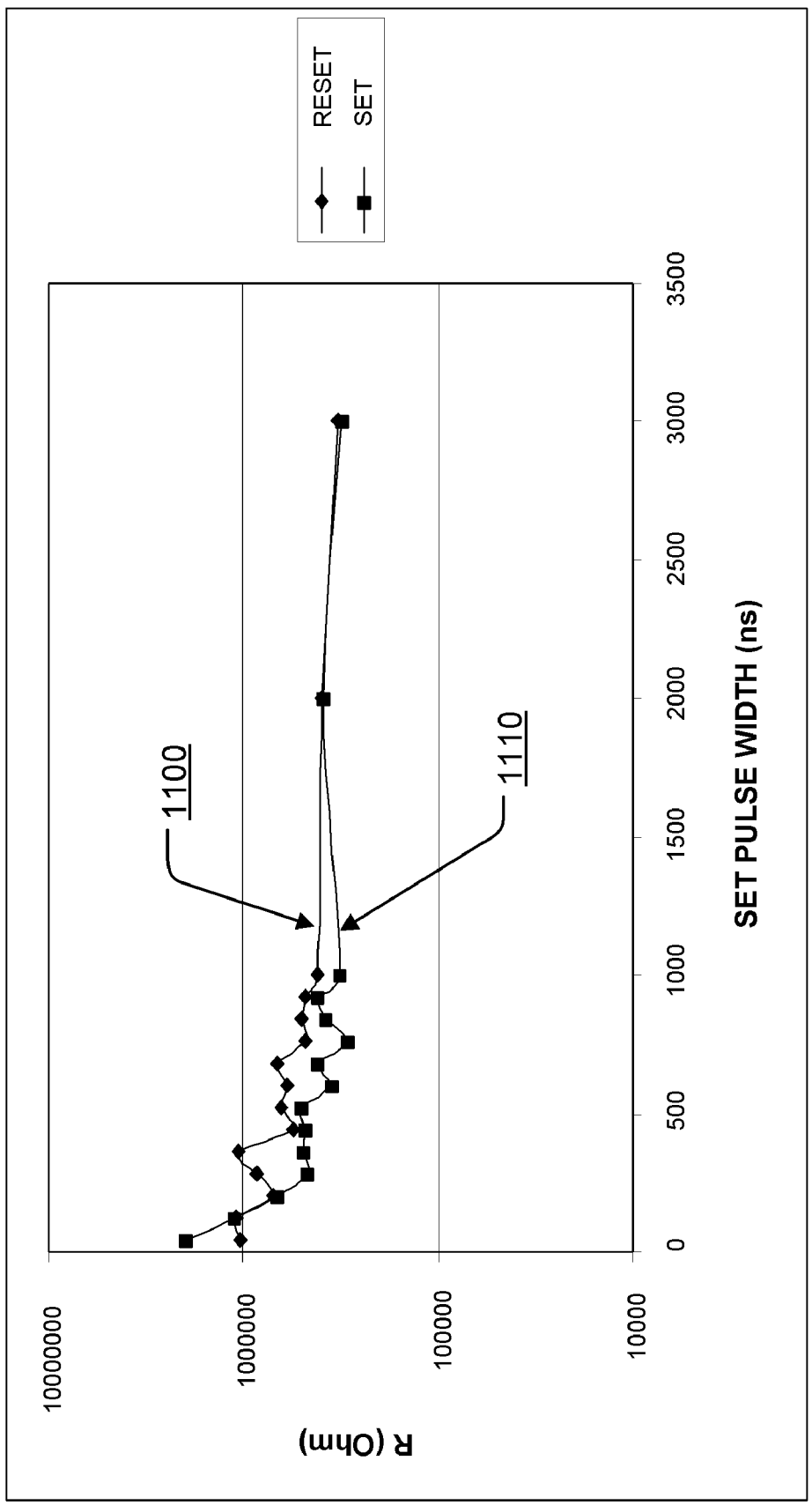
FIG. 11E is the measured resistance of the memory element after each of the steps of the sequence of FIG. 11A.

FIG. 11E is the measured resistance of the memory element 220 after each of the steps of the sequence of FIG. 11A. As can be seen in the data of FIG. 11E, the set operation of step 1110 having the same voltage polarity across the memory element 220 as the reset operation of step 1100 is unsuccessful in setting the device to the lower resistance state.

Figure 12A:
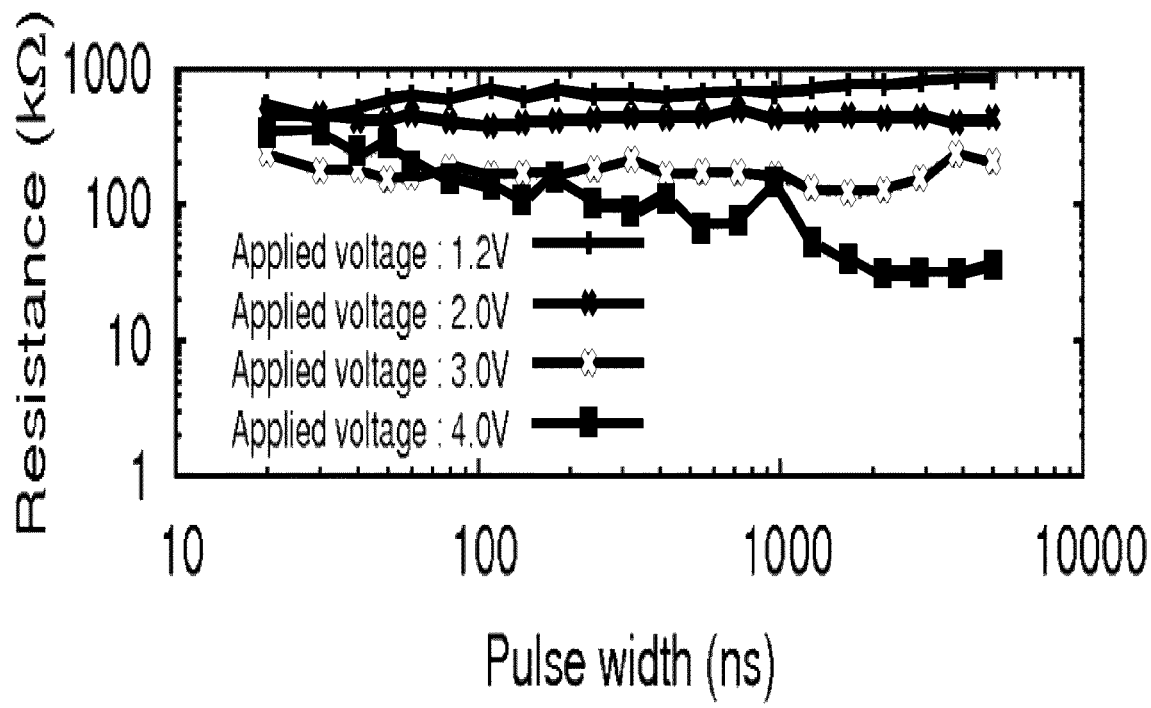
FIG. 12A is the measured resistance of the memory element as a function of pulse width for set pulses having various pulse heights ranging from 1.2 V to 4.0 V.
Figure 12B:
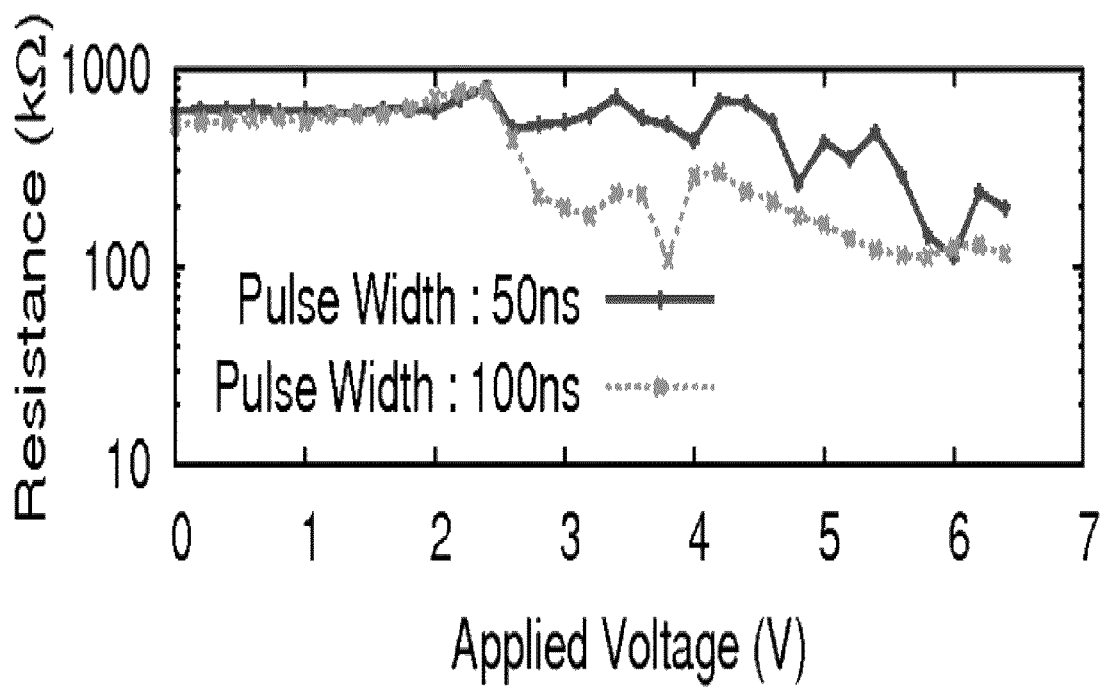
FIG. 12B is the measured resistance of the memory element as a function of pulse height.

FIGS. 12A and 12B further show the difficulty in setting the memory cell of FIG. 10 to the lower resistance state using set and reset operations of the same voltage polarity. FIGS. 12A and 12B are the measured resistance as a function of set pulse width and set pulse amplitude of the memory cell of FIG. 10. The data of FIGS. 12A-12B was measured on a memory element 220 having a width of about 20 nm and a length of about 60 nm.

The device can be reset using a reset pulse above 3 V with a pulse width of 30 ns. FIG. 12A is the measured resistance of the memory element 220 as a function of pulse width for set pulses having various pulse heights ranging from 1.2 V to 4.0

V. FIG. 12B is the measured resistance of the memory element 220 as a function of pulse height for set pulses having a rise time of 5 ns and a fall time of 30 ns and pulse widths of 50 ns and 100 ns. As can be seen in the data of FIGS. 12A-12B, the resistance is reduced only when the set pulse height is high and/or the pulse width is long when using set and reset operations of the same voltage polarity. The high set voltage and long pulse width are not desirable because it can exert large electrical and mechanical stresses on the device which can ultimately damage and cause failure to the device.

Figure 13A:
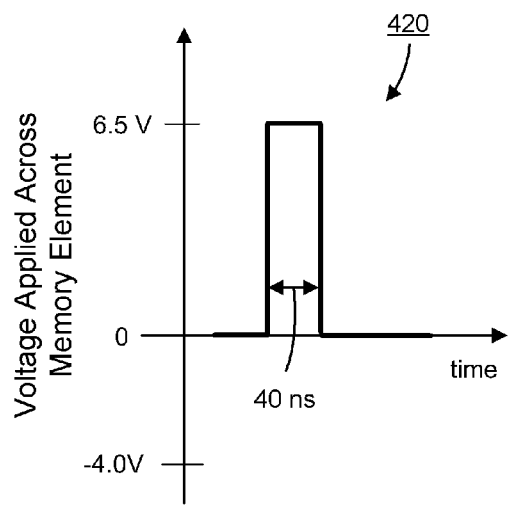
FIGS. 13A and 13B are simplified timing diagrams of the reset and set operations of FIGS. 4A and 4B which overcome the difficult to set behavior of programming a memory element from the higher resistance reset state to the resistance state.
Figure 13B:
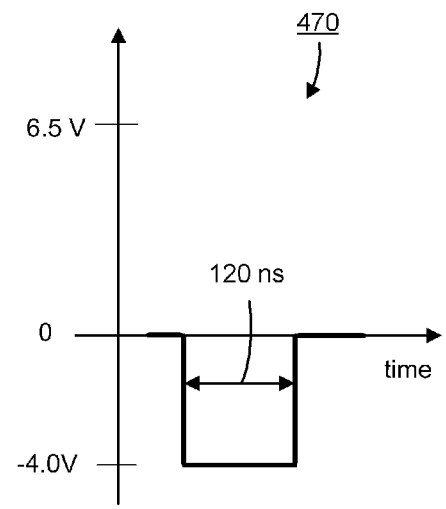

FIGS. 13A and 13B are simplified timing diagrams of the reset operation 400 of FIG. 4A and the set operation 450 of FIG. 4B respectively which overcomes the "difficult to set" behavior of the memory cell of FIG. 10 with a memory element 220 having width of about 50 nm and a length of about 50 nm. In FIG. 13A the reset bias arrangement of step 420 is a voltage pulse having a pulse height of 6.5 V and a pulse width of 40 ns. In FIG. 13B the set bias arrangement of step 470 is a voltage pulse having a pulse height of 4.0 V and a pulse width of 120 ns. The rise and fall times of the pulses were set to be as small as practical. Due to instrument limitations, the rise and fall times were actually about 2 ns each in the measured results. The voltage pulse of the reset bias arrangement of step 470 has a voltage polarity across the memory element 220 opposite that of the voltage pulse of the set bias arrangement of step 420.

Figure 13C:
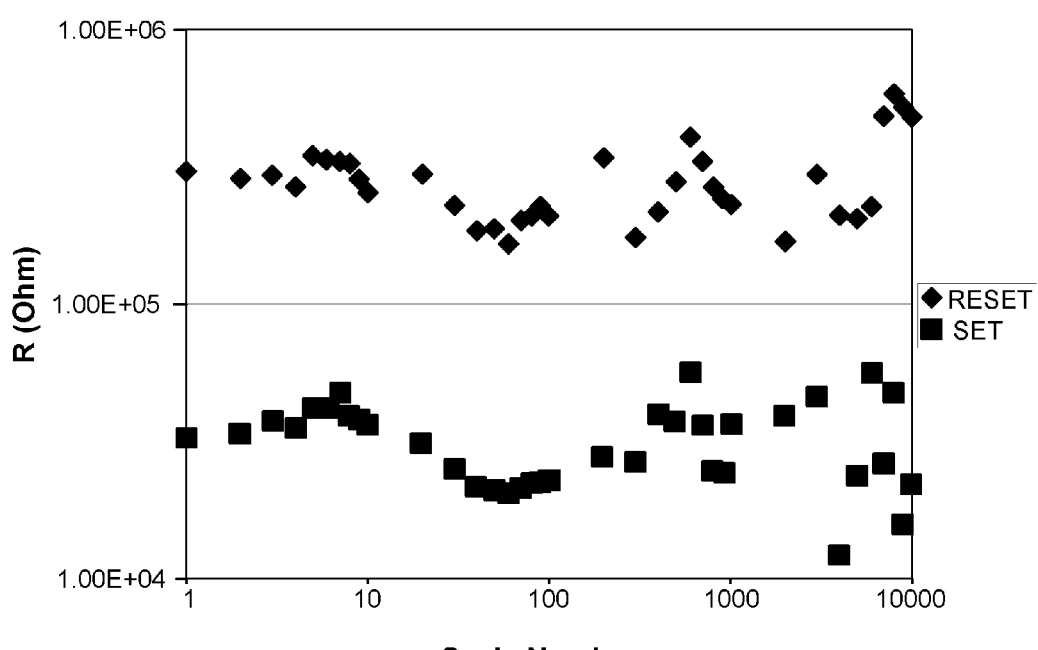
FIG. 13C is the measured resistance of a cycle endurance test of the cell using the set and reset operations of FIGS. 13A-13B.

FIG. 13C is the measured resistance of a cycle endurance test of the memory element 220 using the pulse of FIG. 13A to change to the lower resistance state, and using the pulse of FIG. 13B to change to the higher resistance state. As can be seen in the data of FIG. 13C, the "difficult to set" behavior is overcome and the memory cell is successfully set to the lower resistance state.

The discussion below with respect to FIGS. 14A-14C further demonstrate the use of opposite polarity pulses of the set and reset operations described herein for overcoming the "difficult to set" behavior.

FIG. 14A is a flow diagram of an operational sequence applied to the memory cell of FIG. 10 with a memory element 220 having width of about 50 nm and a length of about 50 nm. The sequence begins at step 1400 by applying a reset pulse of 5.5 V having a pulse width of 40 ns across the memory element. The rise and fall times of the pulse were set to be as small as practical. Due to instrument limitations, the rise and fall times were actually about 2 ns each in the measured results.

Next, a set pulse having the same voltage polarity as the reset pulse of step 1400 across the memory element is applied at step 1410. As represented by the simplified timing diagram of FIG. 14B, the set pulse of step 1410 has a pulse height of 3.0 V and a pulse width of 40 ns.

Next, the reset pulse of 5.5 V with a pulse width of 40 ns is applied at step 1420. Next, a set pulse having the opposite voltage polarity as the reset pulse of steps 1400 and 1410 across the memory element is applied at step 1430. As represented by the simplified timing diagram of FIG. 14C, the set pulse of step 1430 has a pulse height of 3.0 V and a pulse width of 40 ns.

Figure 14D:
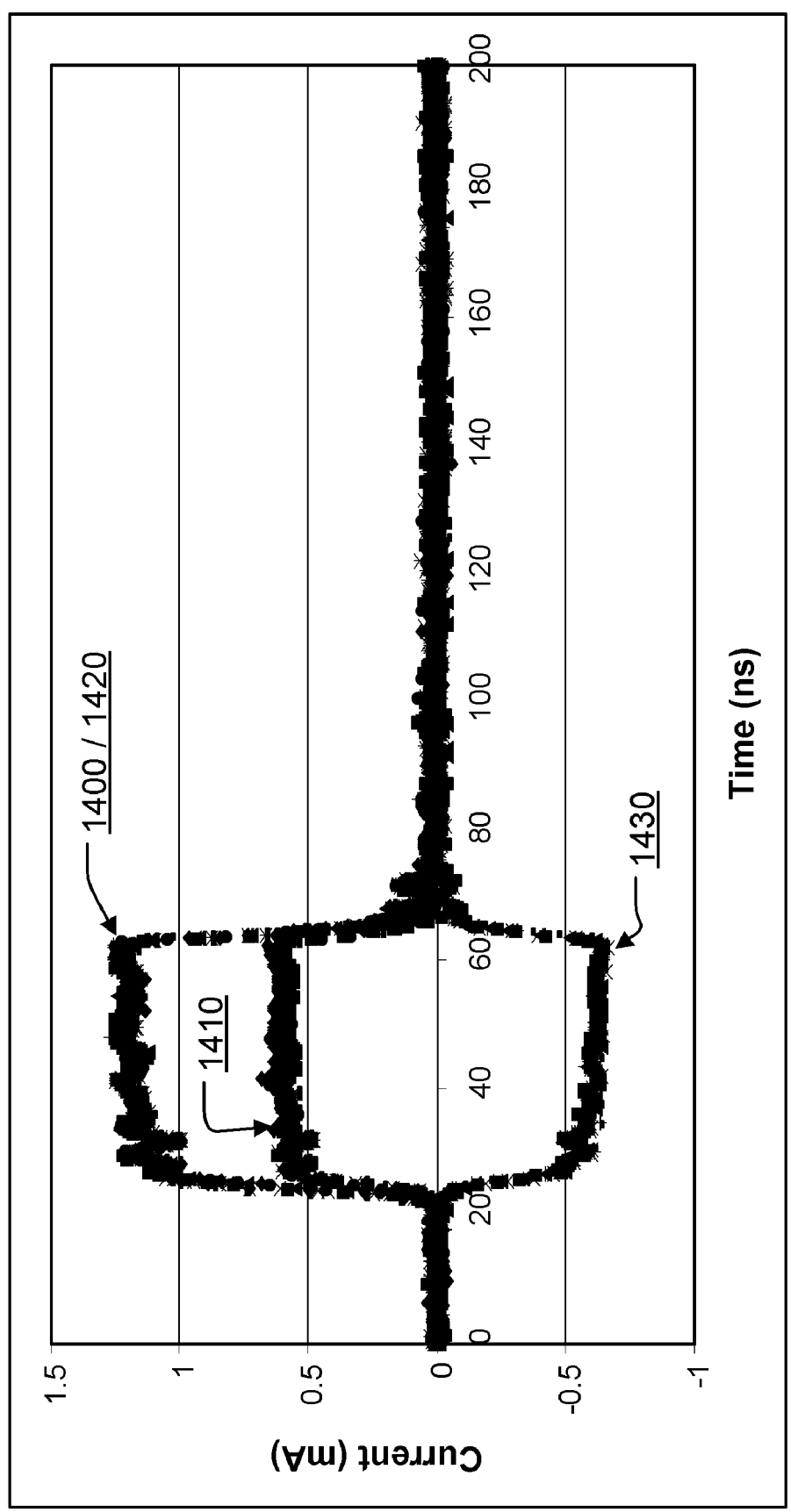
FIG. 14D is the measured current through the memory element for the various steps of the sequence of FIG. 14A.

FIG. 14D is the measured current through the memory element for the various steps of the sequence of FIG. 14A.

Figure 14E:
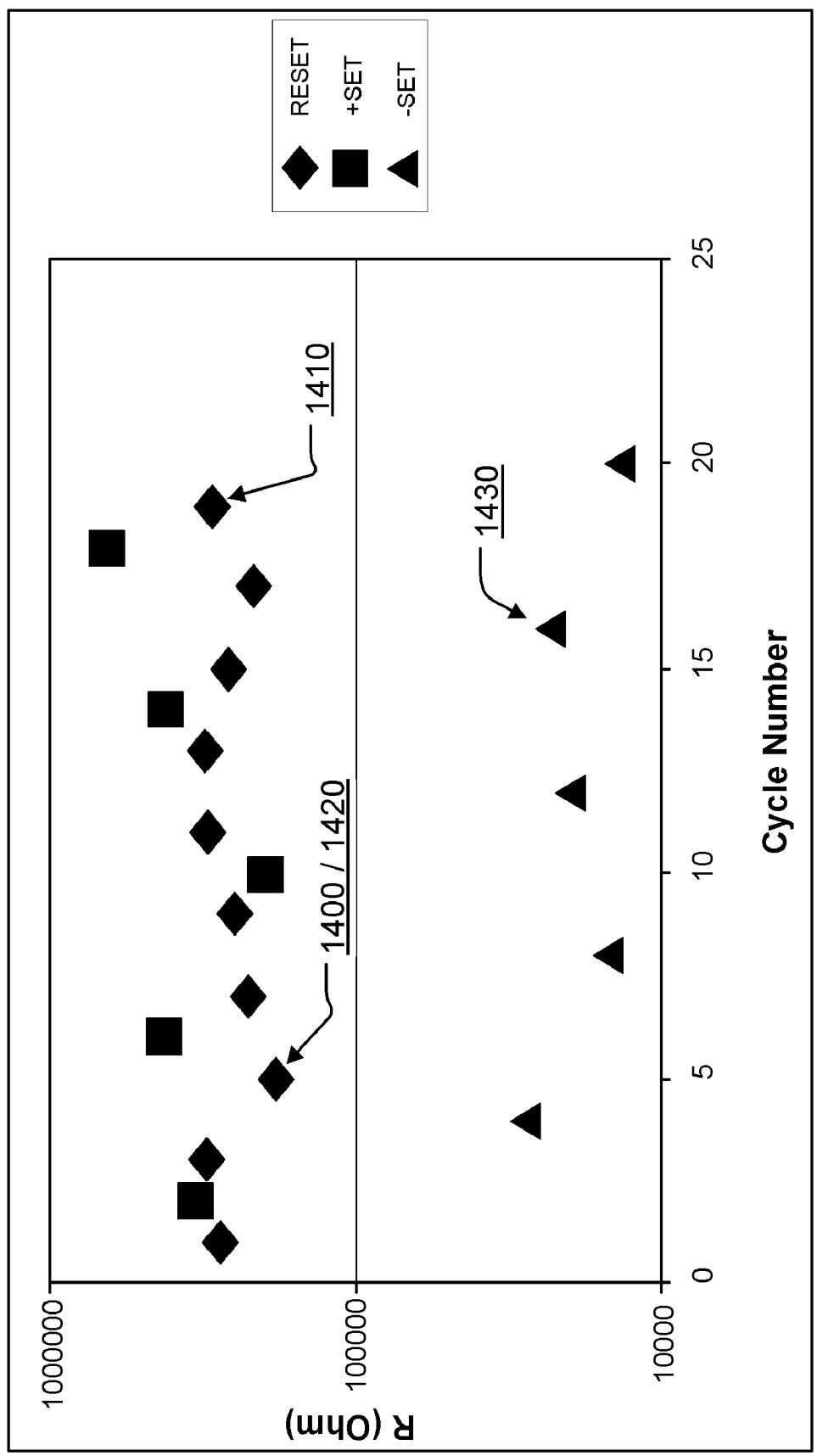
FIG. 14E is the measured resistance of the memory element after each of the steps of the sequence of FIG. 14A.

FIG. 14E is the measured resistance of the memory element after each of the steps of the sequence of FIG. 14A. As can be seen in the data of FIG. 14E, the set operation of step 1410 is unsuccessful in setting the device, while the set operation of step 1430 successfully sets the device to the lower resistance state.

Figure 15A:
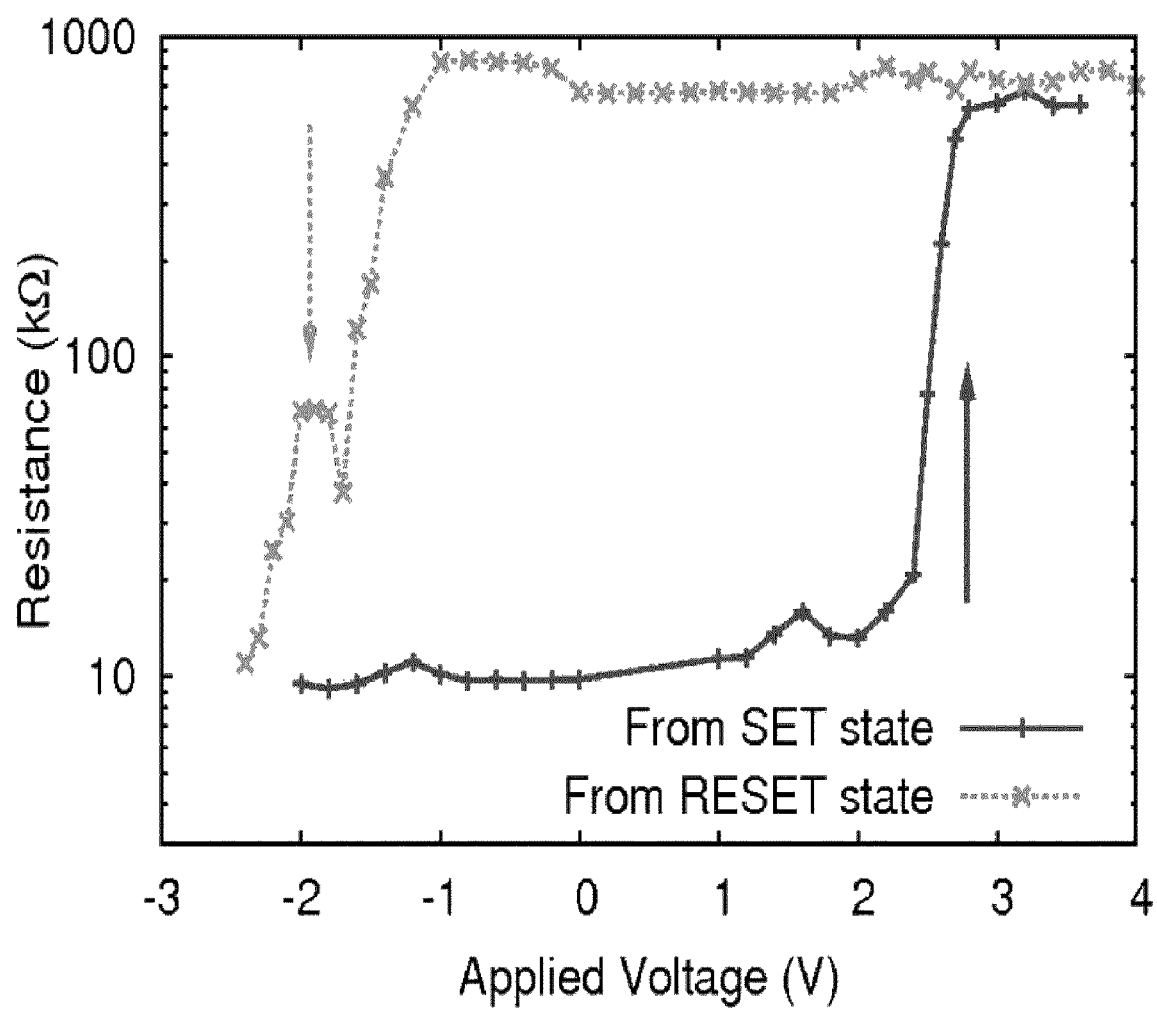
FIG. 15A is the measured resistance-voltage characteristics of the memory cell of FIG. 10 for both the set-to-reset and reset-to-set transitions by varying the pulse height of the set and reset pulses of FIG. 15B.
Figure 15B:
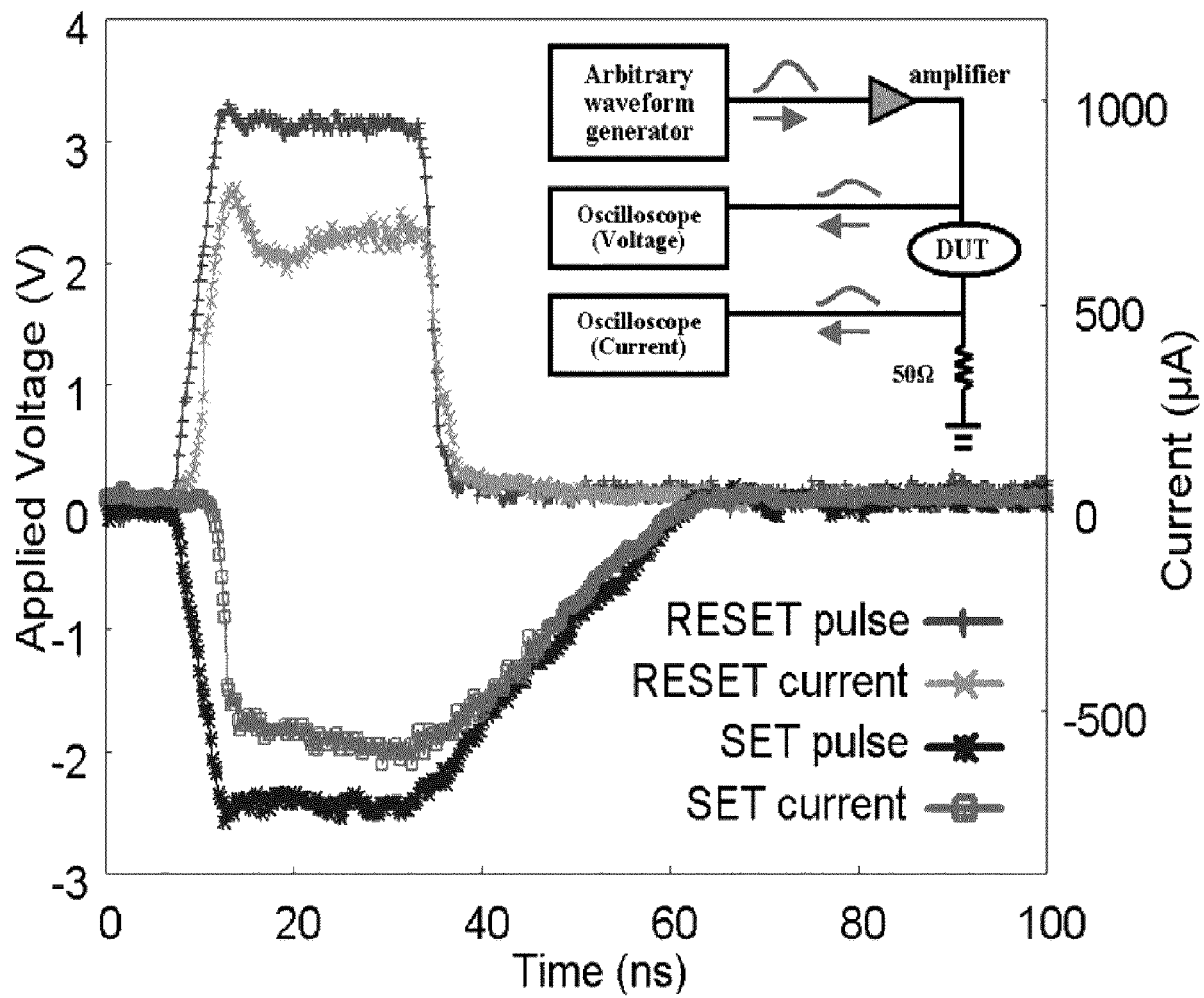

FIG. 15A is measured resistance-voltage (R-V) characteristics of the memory cell of FIG. 10 for both the set-to-reset and reset-to-set transitions by varying the pulse height of set and reset voltage pulses as shown in FIG. 15B. The data of FIG. 15A was measured on a memory element 220 having a width of about 20 nm and a length of about 60 nm. This data shows the resistance transitions between the lower resistance set state and the higher resistance reset state after different programming pulses. For the set-to-reset test the device is always programmed to the set state before a reset pulse is applied, and for the reset-to-set test the device is always programmed to the reset state before a set pulse is applied. The reset pulse of FIG. 15B used to obtain the data of FIG. 15A has a rise time of 5 ns, a fall time of 2 ns, and a pulse width of 20 ns. The set pulse of FIG. 15B used to obtain the data of FIG. 15A has a rise time of 5 ns, a fall time of 30 ns, and a pulse width 20 ns.

As can be seen in FIG. 15A, the resistance increases abruptly from the set state to the reset state using a positive reset pulse having a pulse height larger than 2.8 V. The reset state to set state transition is completed using a negative set pulse having a pulse height small than −2.2 V.

Thus, as can be seen in the data of FIG. 15A, the phase change memory device can be set using pulse widths of 60 ns or less. As a result, the phase change memory devices and methods for operating described herein overcome the slow set behavior commonly associated with phase change memory devices, and extend their usefulness into high speed applications such as DRAM which require a set pulse width less than or equal to 60 ns.

Figure 16:
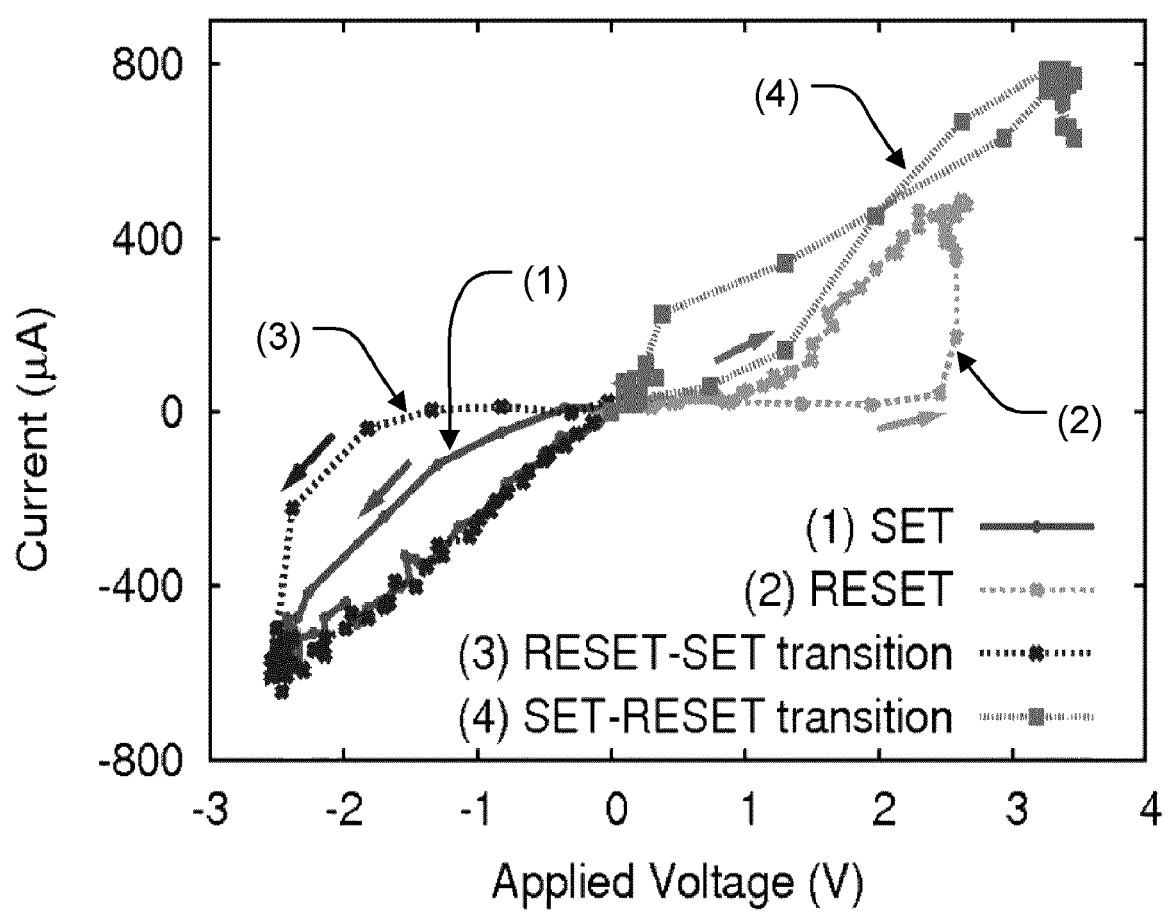
FIG. 16 is measured current-voltage curves of the memory cell during reset and set operations.

In order to confirm that the resistive switching behavior as shown in FIG. 15 is a phase change operation, four current-voltage (IV curves) are depicted in FIG. 16 for reset and set operations. The data of FIG. 16 was measured on the memory cell of FIG. 10 having a memory element 220 with a width of about 20 nm and a length of about 60 nm. The pulse height of the reset and set pulses are 3.4 V and (±) 2.5 V, respectively. The reset pulse has a pulse width of 20 ns and rise and fall times of 5 ns and 0 ns respectively, and the set pulse has a pulse width of 20 ns and rise and fall times of 5 ns and 30 ns respectively.

Lines (2) and (3) of FIG. 16 are measured IV curves of a device which is initially in the higher resistance reset state. In the data of line (2) the initial resistance is 805 k ohm and a set pulse of +2.5 V is applied across the memory element. In the data of line (3) the initial resistance is 704 k ohm and a set pulse of −2.5 V is applied across the memory element.

As can be seen in the data of line (2), applying a +2.5 V set pulse having the same voltage polarity as the reset pulse shows a transition to a lower resistance as the voltage approaches +2.5 V. However, as can be seen in the data of line (2) this lower resistance transition is temporary, and the resistance of the device returns to the higher resistance state after the set pulse of +2.5 V is terminated. In the data of line (2) the device returns to the higher resistance state once the set pulse reaches a voltage $V_{HOLD}$ of about 0.8 V.

As can be seen in the data of line (3), applying a −2.5 V set pulse of opposite voltage polarity as the reset pulse also shows a transition to a lower resistance. However, unlike the data of line (2), the lower resistance transition of line (3) is maintained after the set pulse of −2.5 V is terminated which indicates that the memory element has undergone a phase change.

Lines (1) and (4) of FIG. 16 are measured IV curves of a device which is initially in the lower resistance set state. In the data of line (1) and line (4) the initial resistances are less than 20 k ohm. The lines (1) and (4) are typical of a set device.

In the data of line (4), applying a +3.4 V reset pulse causes a transition from the lower resistance state to the higher resistance state. In the data of line (1), applying a −2.5 V set pulse causes a slight decrease in the resistance of the device, but the device maintains the lower resistance state.

The data of FIG. 16 indicate that the resistive switching behavior is a phase change operation, and that uni-polar operation is not practical for this device.

The operations described herein comprising set and reset bias arrangements having opposite polarity pulses have been demonstrated to overcome the "difficult to set" behavior of memory cell structures such as small bridge-type memory cells which suffer significant thermo-electric effects that cause asymmetrical heating in the body of the phase change material. Representative configurations suffering this "difficult to set" behavior have an active region with a heating zone during a set operation which is spaced away from electrodes contacting the phase change material. Bridge cells having a thickness of between about 3 and 20 nm and pillar cells having a width or diameter less than 25 nm are typical structures to which the operations described herein can be applied to overcome "difficult to set" behavior.

Representative configurations suffering this "difficult to set" behavior can also have a relatively long current path through the phase change material and a cross-sectional area that is small relative to the current path. Examples include bridge cells having a thickness less than 10 nm, and a length between electrodes which is defined by the width of the insulating member of greater than 10 nm.

In particular, "difficult to set" memory cells include phase change materials such as $Ge_xSb_yTe_z$ and $Ge_xTe_y$ which transition to the set state in a nucleation dominated mode in which crystallization is initiated from numerous locations within the material.

Figure 17:
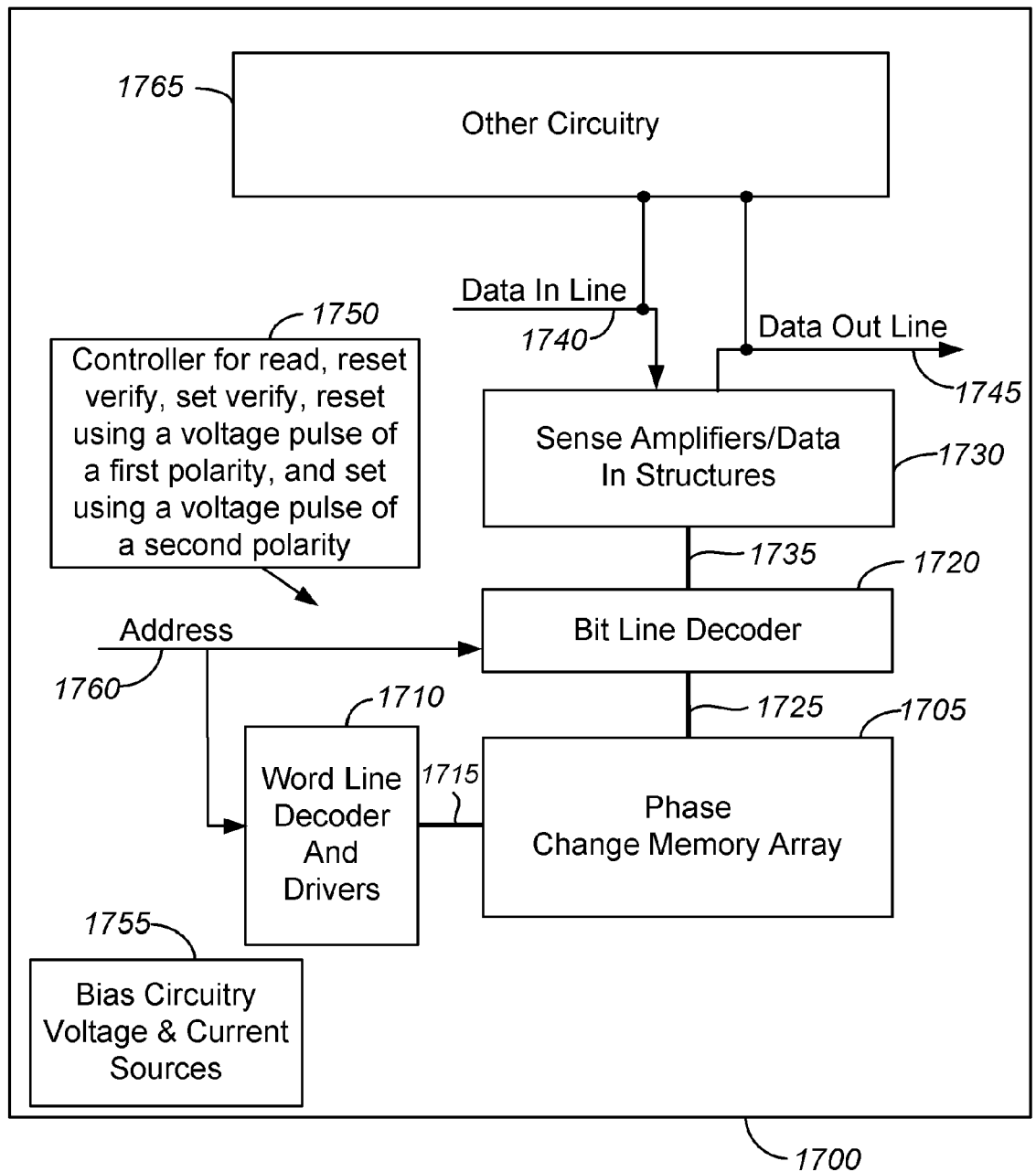
FIG. 17 is a simplified block diagram of an integrated circuit in which the operations described herein can be implemented.

FIG. 17 is a simplified block diagram of an integrated circuit 1700 in which the operations overcoming "the difficult to set" behavior as described herein can be implemented. The integrated circuit 1700 includes a memory array 1705 of memory cells having phase change memory elements programmable to a plurality of resistance states including a lower resistance state and a higher resistance state. A word line decoder 1710 having read, reset verify, set verify, reset using a voltage pulse of a first polarity, and set using a voltage pulse of a second polarity modes is coupled to and in electrical communication with a plurality of word lines 1715 arranged along rows in the memory array 1705. A bit line (column) decoder 1720 is in electrical communication with a plurality of bit lines 1725 arranged along columns in the array 1705 for reading and programming the memory cells (not shown) in array 1705.

Addresses are supplied on bus 1760 to word line decoder and drivers 1710 and bit line decoder 1720. Sense circuitry (Sense amplifiers) and data-in structures in block 1730, including voltage and/or current sources for the read and program modes are coupled to bit line decoder 1720 via data bus 1735. Data is supplied via a data-in line 1740 from input/output ports on integrated circuit 1700, or from other data sources internal or external to integrated circuit 1700, to data-in structures in block 1730. Other circuitry 1765 may be included on integrated circuit 1700, such as a general purpose processor or special purpose application circuitry, or a combination of modules providing system-on-a-chip functionality supported by array 1705. Data is supplied via a data-out line 1745 from the sense amplifiers in block 1730 to input/output ports on integrated circuit 1700, or to other data destinations internal or external to integrated circuit 1700.

The integrated circuit 1710 includes a controller 1750 for read, reset verify, set verify, reset using a voltage pulse of a first polarity, and set using a voltage pulse of a second polarity modes of the memory cells of the array 1705. The controller 1750, implemented in this example using a bias arrangement state machine, controls the application of bias circuitry voltage & current sources 1755 for the application of bias arrangements including read, set and reset to the word lines 1715, bit lines 1725, and in some embodiments source lines. Controller 1750 may be implemented using special-purpose logic circuitry as known in the art. In alternative embodiments, controller 1750 comprises a general-purpose processor, which may be implemented on the same integrated circuit to execute a computer program to control the operations of the device. In yet other embodiments, a combination of special-purpose logic circuitry and a general-purpose processor may be utilized for implementation of controller 1750.

Figure 18:
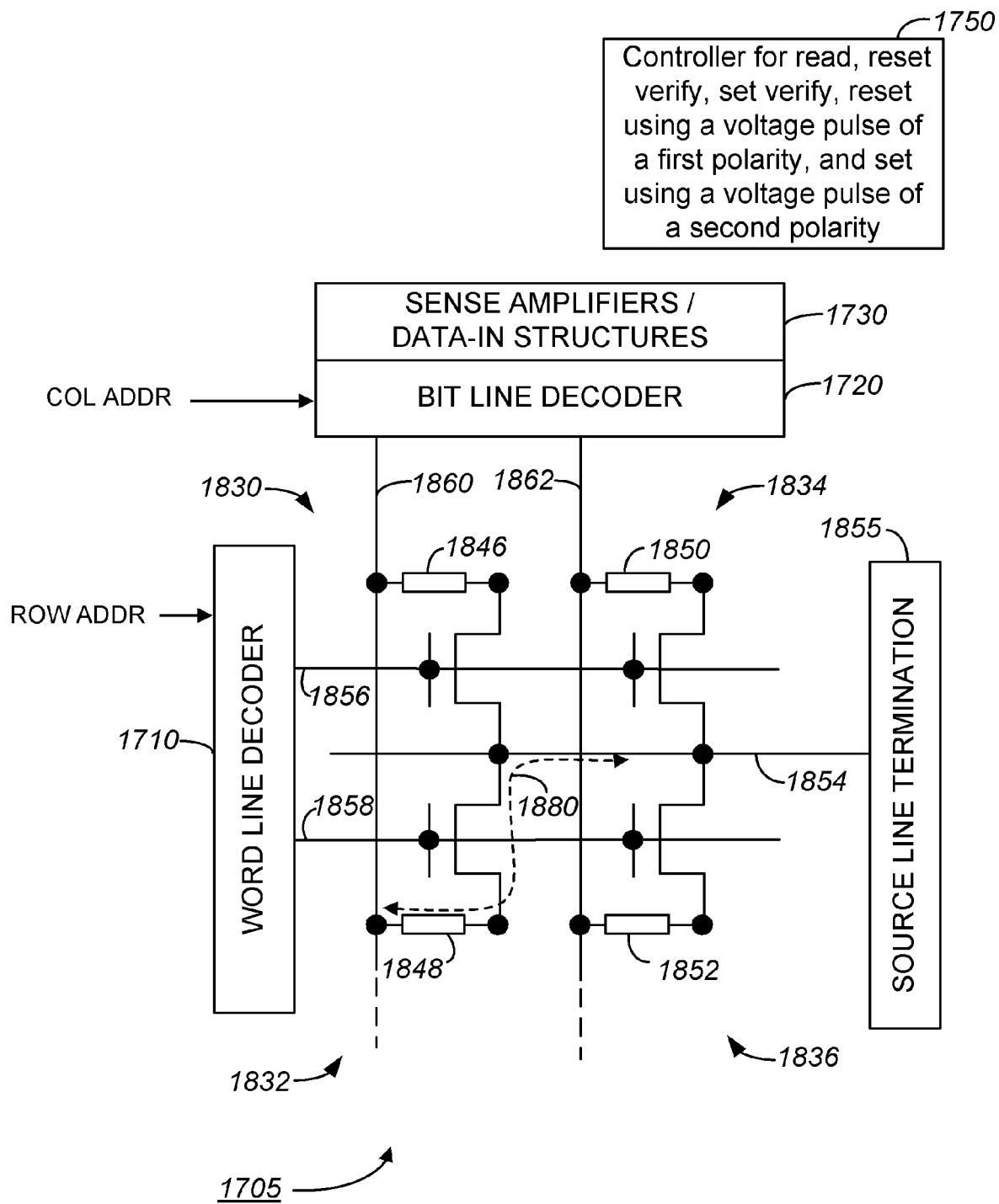
FIG. 18 is a schematic diagram of a portion of the memory array of the integrated circuit of FIG. 17.

As shown in FIG. 18, each of the memory cells of array 1705 includes an access transistor (or other access device such as a diode) and a phase change memory element. In FIG. 18 four memory cells 1830, 1832, 1834, 1836 having respective memory elements 1840, 1842, 1844, 1846 are illustrated, representing a small section of an array that can include millions of memory cells. The memory elements are programmable to a plurality of resistance states including a lower and a higher resistance state.

Sources of each of the access transistors of memory cells 1830, 1832, 1834, 1836 are connected in common to source line 1854 that terminates in source line termination circuit 1855, such as a ground terminal. In another embodiment the source lines of the access devices are not electrically connected, but independently controllable. The source line termination circuit 1855 may include bias circuitry such as voltage sources and current sources, and decoding circuits for applying bias arrangements, other than ground, to the source line 1854 in some embodiments.

A plurality of word lines including word lines 1856, 1858 extend in parallel along a first direction. Word lines 1856, 1858 are in electrical communication with word line decoder 1710. The gates of access transistors of memory cells 1830 and 1834 are connected to word line 1856, and the gates of access transistors of memory cells 1832 and 1836 are connected in common to word line 1858.

A plurality of bit lines including bit lines 1860, 1862 extend in parallel in a second direction and are in electrical communication with bit line decoder 1818. In the illustrated embodiment each of the memory elements are arranged between the drain of the corresponding access device and the corresponding bit line. Alternatively, the memory elements may be on the source side of the corresponding access device.

It will be understood that the memory array 1805 is not limited to the array configuration illustrated in FIG. 18, and additional array configurations can also be used. Additionally, instead of MOS transistors, bipolar transistors may be used as access devices in some embodiments.

In operation each of the memory cells in the array 1805 store data depending upon the resistance of the corresponding memory element. The data value may be determined, for example, by comparison of current on a bit line for a selected memory cell to that of a suitable reference current by sense amplifiers of sense circuitry 1824. The reference current can be established so that a predetermined range of currents correspond to a logical "0", and a differing range of currents correspond to a logical "1". In a memory cell having three or more states, reference currents can be established so that differing ranges of bit line currents correspond to each of the three or more states.

Reading, or writing to a memory cell of array 1705 can be achieved by applying a suitable voltage to one of word lines 1856, 1858 and coupling one of bit lines 1860, 1862 to a voltage so that current flows through the selected memory cell. For example, a current path 1880 through a selected memory cell (in this example memory cell 1832 and corresponding memory element 1848) is established by applying voltages to the bit line 1860, word line 1858, and source line 1854 sufficient to turn on the access transistor of memory cell 1832 and induce current in path 1880 to flow from the bit line 1860 to the source line 1854, or vice-versa. The level and duration of the voltages applied is dependent upon the operation performed.

In a read (or sense) operation of memory cell 1832, word line decoder 1810 facilitates providing word line 1858 with a suitable voltage to turn on the access transistor of the memory cell 1832. Bit line decoder 1820 facilitates supplying a voltage to bit line 1860 of suitable amplitude and duration to induce current to flow that does not result in the memory element 1848 undergoing a change in resistive state. The current on the bit line 1860 and through the memory element 1848 is dependent upon the resistance of, and therefore the data state associated with, the memory element 1848 of the memory cell 1832. Thus, the data state of the memory cell may be determined, for example by comparison of the current on bit line 1860 with a suitable reference current by sense amplifiers of sense circuitry 1830.

In a reset operation of a data value to be stored in the memory cell 1832, bias circuitry voltage and current sources 1855 coupled to the array 1705 applies a reset bias arrangement as described herein comprising one or more pulses to the bit line 1860 and/or word line 1858 and/or source line 1854 to induce current in path 1880. The resultant pulses of across the memory element 1848 change the resistance state of the memory element 1848 from the lower resistance state to the higher resistance state.

In a set operation of a data value to be stored in the memory cell 1832, bias circuitry voltage and current sources 1855 coupled to the array 1705 applies a set bias arrangement as described herein comprising one or more pulses to the bit line 1860 and/or word line 1858 and/or source line 1854 to induce current in path 1880. The resultant pulses across the memory element 1848 change the resistance state of the memory element 1848 from the higher resistance state to the lower resistance state.

Embodiments of the memory cells described herein include phase change based memory materials, including chalcogenide based materials and other materials, for the memory elements. Chalcogens include any of the four elements oxygen (O), sulfur (S), selenium (Se), and tellurium (Te), forming part of group VIA of the periodic table. Chalcogenides comprise compounds of a chalcogen with a more electropositive element or radical. Chalcogenide alloys comprise combinations of chalcogenides with other materials such as transition metals. A chalcogenide alloy usually contains one or more elements from group IVA of the periodic table of elements, such as germanium (Ge) and tin (Sn). Often, chalcogenide alloys include combinations including one or more of antimony (Sb), gallium (Ga), indium (In), and silver (Ag). Many phase change based memory materials have been described in technical literature, including alloys of: Ga/Sb, In/Sb, In/Se, Sb/Te, Ge/Te, Ge/Sb/Te, In/Sb/Te, Ga/Se/Te, Sn/Sb/Te, In/Sb/Ge, Ag/In/Sb/Te, Ge/Sn/Sb/Te, Ge/Sb/Se/Te and Te/Ge/Sb/S. In the family of Ge/Sb/Te alloys, a wide range of alloy compositions may be workable. The compositions can be characterized as $Te_aGe_bSb_{100-(a+b)}$. One researcher has described the most useful alloys as having an average concentration of Te in the deposited materials well below 70%, typically below about 60% and ranged in general from as low as about 23% up to about 58% Te and most preferably about 48% to 58% Te. Concentrations of Ge were above about 5% and ranged from a low of about 8% to about 30% average in the material, remaining generally below 50%. Most preferably, concentrations of Ge ranged from about 8% to about 40%. The remainder of the principal constituent elements in this composition was Sb. These percentages are atomic percentages that total 100% of the atoms of the constituent elements. (Ovshinsky U.S. Pat. No. 5,687,112, cols. 10-11.) Particular alloys evaluated by another researcher include Ge2Sb2Te5, GeSb2Te4 and GeSb4Te7 (Noboru Yamada, "Potential of Ge—Sb—Te Phase-Change Optical Disks for High-Data-Rate Recording", SPIE v.3109, pp. 28-37 (1997).) More generally, a transition metal such as chromium (Cr), iron (Fe), nickel (Ni), niobium (Nb), palladium (Pd), platinum (Pt) and mixtures or alloys thereof may be combined with Ge/Sb/Te to form a phase change alloy that has programmable resistive properties. Specific examples of memory materials that may be useful are given in Ovshinsky '112 at columns 11-13, which examples are hereby incorporated by reference.

Chalcogenides and other phase change materials are doped with impurities in some embodiments to modify conductivity, transition temperature, melting temperature, and other properties of memory elements using the doped chalcogenides. Representative impurities used for doping chalcogenides include nitrogen, silicon, oxygen, silicon dioxide, silicon nitride, copper, silver, gold, aluminum, aluminum oxide, tantalum, tantalum oxide, tantalum nitride, titanium and titanium oxide. See, e.g., U.S. Pat. No. 6,800,504, and U.S. Patent Application Publication No. U.S. 2005/0029502.

Phase change alloys are capable of being switched between a first structural state in which the material is in a generally amorphous solid phase, and a second structural state in which the material is in a generally crystalline solid phase in its local order in the active channel region of the cell. These alloys are at least bistable. The term amorphous is used to refer to a relatively less ordered structure, more disordered than a single crystal, which has the detectable characteristics such as higher electrical resistivity than the crystalline phase. The term crystalline is used to refer to a relatively more ordered structure, more ordered than in an amorphous structure, which has detectable characteristics such as lower electrical resistivity than the amorphous phase. Typically, phase change materials may be electrically switched between different detectable states of local order across the spectrum between completely amorphous and completely crystalline states. Other material characteristics affected by the change between amorphous and crystalline phases include atomic order, free electron density and activation energy. The material may be switched either into different solid phases or into mixtures of two or more solid phases, providing a gray scale between completely amorphous and completely crystalline states. The electrical properties in the material may vary accordingly.

Phase change alloys can be changed from one phase state to another by application of electrical pulses. It has been observed that a shorter, higher amplitude pulse tends to change the phase change material to a generally amorphous state. A longer, lower amplitude pulse tends to change the phase change material to a generally crystalline state. The energy in a shorter, higher amplitude pulse is high enough to allow for bonds of the crystalline structure to be broken and short enough to prevent the atoms from realigning into a crystalline state. Appropriate profiles for pulses can be determined, without undue experimentation, specifically adapted to a particular phase change alloy. In following sections of the disclosure, the phase change material is referred to as GST, and it will be understood that other types of phase change materials can be used. A material useful for implementation of a PCRAM described herein is $Ge_2Sb_2Te_5$.

An exemplary method for forming chalcogenide material uses chemical vapor deposition CVD such as that disclosed in US Publication No 2006/0172067 entitled "Chemical Vapor Deposition of Chalcogenide Materials", which is incorporated by reference herein.

A post-deposition annealing treatment in a vacuum or in an N2 ambient is optionally performed to improve the crystallized state of chalcogenide material. The annealing temperature typically ranges from 100° C. to 400° C. with an anneal time of less than 30 minutes.

While the present invention is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the following claims.

What is claimed is:

1. A method for operating a memory cell comprising a phase change memory element programmable to a plurality of resistance states including a higher resistance state and a lower resistance state, the method comprising:
    applying a reset bias arrangement to the memory cell to change the resistance state from the lower resistance state to the higher resistance state, the reset bias arrangement comprising a first voltage pulse; and
    applying a set bias arrangement to the memory cell to change the resistance state from the higher resistance state to the lower resistance state, the set bias arrangement comprising a second voltage pulse, the second voltage pulse having a voltage polarity different from that of the first voltage pulse.

2. The method of claim 1, wherein the memory cell further comprises first and second electrodes, the phase change memory element electrically coupling the first electrode to the second electrode, and the phase change memory element having an active region spaced away from the first and second electrodes.

3. The method of claim 1, wherein the second voltage pulse has a pulse width less than or equal to 60 ns.

4. The method of claim 1, wherein the memory cell further comprises first and second electrodes and a dielectric spacer between the first electrode and the second electrode, the phase change memory element comprising a bridge of phase change material extending across the phase change memory element to contact the first and second electrodes, the phase change memory element defining an inter-electrode path between the first and second electrodes having an inter-electrode path length defined by a width of the insulating member.

5. The method of claim 4, wherein the phase change memory element has a thickness between 3 and 20 nm.

6. The method of claim 4, wherein the phase change memory element has a thickness less than 10 nm, and the width of the insulating member is greater than 10 nm.

7. The method of claim 1, wherein the memory cell further comprises first and second electrodes, the phase change memory element comprising a pillar of phase change material surrounded by a dielectric and electrically coupling the first electrode to the second electrode, the pillar of phase change material having a width less than that of the first and second electrodes.

8. The method of claim 7, wherein the width of the pillar of phase change material is less than 25 nm.

9. The method of claim 1, wherein the phase change memory element comprises $Ge_xSb_yTe_z$.

10. The method of claim 1, wherein the phase change memory element comprises a nucleation dominated material.

11. A memory device comprising:
    a memory cell comprising a phase change memory element programmable to a plurality of resistance states including a higher resistance state and a lower resistance state; and
    bias circuitry adapted to apply bias arrangements to the memory cell, the bias arrangements comprising:
        a reset bias arrangement to change the resistance state from the lower resistance state to the higher resistance state, the reset bias arrangement comprising a first voltage pulse; and
        a set bias arrangement to change the resistance state from the higher resistance state to the lower resistance state, the set bias arrangement comprising a second voltage pulse, the second voltage pulse having a voltage polarity different from that of the first voltage pulse.

12. The device of claim 11, wherein the memory cell further comprises first and second electrodes, the phase change memory element electrically coupling the first electrode to the second electrode, and the phase change memory element having an active region spaced away from the first and second electrodes.

13. The device of claim 11, wherein the second voltage pulse has a pulse width less than or equal to 60 ns.

14. The device of claim 11, wherein the memory cell further comprises first and second electrodes and a dielectric spacer between the first electrode and the second electrode, the phase change memory element comprising a bridge of phase change material extending across the phase change memory element to contact the first and second electrodes, the phase change memory element defining an inter-electrode path between the first and second electrodes having an inter-electrode path length defined by a width of the insulating member.

15. The device of claim 14, wherein the phase change memory element has a thickness between 3 and 20 nm.

16. The device of claim 14, wherein the phase change memory element has a thickness less than 10 nm, and the width of the insulating member is greater than 10 nm.

17. The device of claim 11, wherein the memory cell further comprises first and second electrodes, the phase change memory element comprising a pillar of phase change material surrounded by a dielectric and electrically coupling the first electrode to the second electrode, the pillar of phase change material having a width less than that of the first and second electrodes.

18. The device of claim 17, wherein the width of the pillar of phase change material is less than 25 nm.

19. The device of claim 11, wherein the phase change memory element comprises $Ge_xSb_yTe_z$.

20. The device of claim 11, wherein the phase change memory element comprises a nucleation dominated material.

* * * * *